United States Patent
Vellanki et al.

(10) Patent No.: US 11,460,784 B2
(45) Date of Patent: Oct. 4, 2022

(54) METHOD FOR DETERMINING CANDIDATE PATTERNS FROM SET OF PATTERNS OF A PATTERNING PROCESS

(71) Applicant: ASML NETHERLANDS B.V., Veldhoven (NL)

(72) Inventors: Venugopal Vellanki, San Jose, CA (US); Mark Christopher Simmons, Santa Clara, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/272,505

(22) PCT Filed: Sep. 20, 2019

(86) PCT No.: PCT/EP2019/075321
§ 371 (c)(1),
(2) Date: Mar. 1, 2021

(87) PCT Pub. No.: WO2020/064542
PCT Pub. Date: Apr. 2, 2020

(65) Prior Publication Data
US 2021/0325786 A1    Oct. 21, 2021

Related U.S. Application Data

(60) Provisional application No. 62/735,377, filed on Sep. 24, 2018.

(51) Int. Cl.
*G03F 7/20*    (2006.01)

(52) U.S. Cl.
CPC ........ *G03F 7/7065* (2013.01); *G03F 7/70508* (2013.01); *G03F 7/70625* (2013.01)

(58) Field of Classification Search
CPC . G03F 7/7065; G03F 7/70508; G03F 7/70625
See application file for complete search history.

(56) References Cited

U.S. PATENT DOCUMENTS

| | | | |
|---|---|---|---|
| 6,961,116 B2 | 11/2005 | Den Boef et al. | |
| 8,341,561 B2 * | 12/2012 | Park | G03F 1/36 716/54 |

(Continued)

FOREIGN PATENT DOCUMENTS

TW    201732454    9/2017

OTHER PUBLICATIONS

International Search Report and Written Opinion issued in corresponding PCT Patent Application No. PCT/EP2019/075321, dated Dec. 11, 2019.

*Primary Examiner* — Hung V Nguyen
(74) *Attorney, Agent, or Firm* — Pillsbury Winthrop Shaw Pittman LLP

(57) ABSTRACT

A method of determining candidate patterns from a set of patterns of a patterning process. The method includes obtaining (i) a set of patterns of a patterning process, (ii) a search pattern having a first feature and a second feature, and (iii) a search condition comprising a relative position between the first feature and the second feature of the search pattern; and determining a set of candidate patterns from the set of patterns that satisfies the search condition associated with the first feature and the second feature of the search pattern.

20 Claims, 21 Drawing Sheets

(56) References Cited

U.S. PATENT DOCUMENTS

| | | |
|---|---|---|
| 2006/0066855 A1 | 3/2006 | Boef et al. |
| 2015/0154340 A1 | 6/2015 | Van Gisbergen et al. |
| 2015/0199583 A1* | 7/2015 | Nagatomo ................ G06T 7/74 |
| | | 382/145 |
| 2015/0227670 A1* | 8/2015 | Gordon ................ G06F 30/398 |
| | | 716/52 |
| 2016/0125120 A1 | 5/2016 | Yu et al. |
| 2018/0373162 A1 | 12/2018 | Slotboom et al. |

* cited by examiner

METHOD FOR DETERMINING CANDIDATE PATTERNS FROM SET OF PATTERNS OF A PATTERNING PROCESS

CROSS-REFERENCE TO RELATED APPLICATIONS

This application is the U.S. national phase entry of PCT Patent Application No. PCT/EP2019/075321 which was filed Sep. 20, 2019, which claims the benefit of priority of U.S. patent application Ser. No. 62/735,377 which was filed on Sep. 24, 2018 and which is incorporated herein in its entirety by reference.

TECHNICAL FIELD

The description herein relates generally to a patterning process and a searching for a desired pattern. More particularly, an apparatus or a method for determining patterns within a field pattern or a substrate pattern that match the desired pattern.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching the pattern using an etch apparatus, etc.

SUMMARY

According to an embodiment there is provided a method of determining candidate patterns from a set of patterns of a patterning process. The method includes steps for obtaining (i) a set of patterns of a patterning process, (ii) a search pattern having a first feature and a second feature, and (iii) a first search condition comprising a relative position between the first feature and the second feature of the search pattern; and determining, via a processor, a first set of candidate patterns from the set of patterns that satisfies the first search condition associated with the first feature and the second feature of the search pattern. In an embodiment, the second feature is adjacent to the first feature.

In an embodiment, the relative position is defined between an element of the first feature and an element of the second feature of the search pattern.

In an embodiment, the element comprises an edge, and/or a vertex of the respective feature.

In an embodiment, the first search condition further comprises a tolerance limit associated with the relative position between elements of the features and/or a dimension of the features.

In an embodiment, the first feature and the second feature are on a same layer.

In an embodiment, the first feature and the second feature are on different layers.

In an embodiment, the method further includes obtaining a bounding box around the search pattern and a second search condition associated with the bounding box and a feature of the search pattern; and determining, via the processor, a second set of candidate patterns from the first set of candidate patterns that satisfies the second search condition associated the bounding box.

In an embodiment, the second search condition comprises a relative position between an edge of the feature of the search pattern and an edge of the bounding box.

In an embodiment, the relative position is a distance, and/or an angle between the edge of the feature of the search pattern and the edge of the bounding box In an embodiment, the second search condition further comprises a tolerance limit associated with the relative position between an element of the feature of the search pattern and the bounding box.

In an embodiment, the second search condition is associated with a feature of the search pattern that is closest to the bounding box.

In an embodiment, the determining the second set of candidate patterns further includes comparing one or more parameters of a feature of the search pattern and corresponding one or more parameters of a feature of the set of patterns.

In an embodiment, wherein the one or more parameters comprises at least one of: an edge of the feature; size of the feature; and topology of the feature.

In an embodiment, the determining the second set of candidate patterns further includes adjusting the bounding box around the search pattern based on the second search condition; and determining the second set of candidate patterns from the first set of candidate patterns that satisfies the second search condition associated the adjusted bounding box.

In an embodiment, the adjusting the bounding box includes increasing and/or decreasing the size of the bounding box relative to increase and/or decrease in the size of the feature of the field pattern and the second search condition.

In an embodiment, an amount of increase and/or decrease in size of the bounding box is within the tolerance limit associated with the relative position between elements of the feature of the search pattern and the bounding box.

In an embodiment, the set of patterns is obtained from an image of patterns of a printed substrate and/or simulated patterns of the substrate.

In an embodiment, the set of patterns is obtained from a scanning electron microscope image.

In an embodiment, the search pattern includes a plurality of features, wherein the plurality of features are on the same layer of the substrate and/or different layers of the substrate.

Furthermore, according to an embodiment there is provided a method of determining candidate patterns from a set of patterns. The method includes obtaining (i) a first set of candidate patterns from a set of patterns based on a first search condition associated with features of a search pattern (ii) a bounding box around the search pattern, and (iii) a second search condition associated with the bounding box and a feature of the search pattern; and determining a second set of candidate patterns from the first set of candidate patterns based on the second search condition.

In an embodiment, the second search condition is a distance, and/or an angle between the edge of the feature of the search pattern and the edge of the bounding box.

In an embodiment, the second search condition further comprises a tolerance limit associated with the distance and/or the angle between an element of the feature of the search pattern and the bounding box.

In an embodiment, the determining the second set of candidate patterns further includes comparing one or more parameters of a feature of the search pattern and corresponding one or more parameters of a feature of the set of patterns; and selecting, based on the comparison, a subset of patterns from the first set of candidate patterns excluding patterns with topological mismatch.

In an embodiment, the one or more parameters comprises at least one of: an edge of the feature; size of the feature; and topology of the feature.

In an embodiment, the determining the second set of candidate patterns further includes adjusting the bounding box around the search pattern based on the second search condition; and determining the second set of candidate patterns from the first set of candidate patterns that satisfies the second search condition associated the adjusted bounding box.

In an embodiment, the adjusting the bounding box includes increasing and/or decreasing the size of the bounding box as a function of the size of the feature of the field pattern and the second search condition.

In an embodiment, an amount of increase and/or decrease in size of the bounding box is within the tolerance limit associated with the relative position between elements of the feature of the search pattern and the bounding box.

Furthermore, according to an embodiment there is provided a method of determining candidate patterns from a set of patterns of a patterning process. The method includes obtaining (i) a first set of candidate patterns from a set of patterns based on a first search condition associated with features of a search pattern (ii) a bounding box around the search pattern, and (iii) a second search condition associated with the bounding box and a feature of the search pattern; and determining a second set of candidate patterns from the first set of candidate patterns based on the second search condition, wherein the second set of candidate patterns include a candidate pattern having an extra feature that is not included in the search pattern.

In an embodiment, the extra feature is adjacent to a feature of the search pattern and within the bounding box.

In an embodiment, the extra feature is on a same layer and/or a different layer than features of the search pattern.

In an embodiment, the extra feature is not associated with constraints relative to the features of the search pattern or the bounding box.

In an embodiment, the determining the second set of candidate patterns further includes comparing one or more parameters of a feature of the search pattern and corresponding one or more parameters of a feature of the set of patterns; and selecting, based on the comparison, patterns from the first set of candidate patterns without excluding patterns with topological mismatch.

In an embodiment, the one or more parameters comprises at least one of: an edge of the feature; size of the feature; and topology of the feature.

Furthermore, according to an embodiment there is provided a method of determining candidate patterns from a set of patterns of a patterning process. The method includes applying, via an interface, a first condition between a first feature and a second feature of the search pattern; determining, via a processor, a first set of candidate patterns on a set of patterns based on the first constraint; drawing, via the interface, a bounding box around the search pattern; applying, via the interface, a second condition between the first feature or the second feature, and the bounding box; and determining, via the processor, a second set of candidate patterns from the first set of candidate patterns based on the second condition, wherein the second set of candidate patterns include a candidate pattern having an extra feature that is not included in the search pattern.

In an embodiment, the applying the first condition includes selecting an edge of the first feature and an edge of the second feature of the search pattern; assigning a distance between the selected edges; and/or assigning a tolerance limit to the distance between the selected edges.

Furthermore, according to an embodiment there is provided a method of generating a search pattern database. The method includes obtaining a set of patterns, a pattern of the set of patterns comprises a plurality of features; applying, via an interface, a set of search conditions to the set of patterns to generate a set of search patterns, wherein a search pattern is associated with a search condition; evaluating, via a processor, whether a conflict exist between one or more search conditions associated with one or more features of the set of patterns; and storing, via the processor, the set of search patterns and associated set of search conditions for which no conflict exist.

In an embodiment, the evaluating the conflicts includes identifying features of the set of patterns having same search conditions; and/or determining whether the search conditions exceed a predetermined threshold related to a feature of a pattern of the set of patterns; and/or displaying the identified features to modify the conditions to eliminate conflict.

Furthermore, according to an embodiment there is provided a computer program product comprising a non-transitory computer readable medium having instructions recorded thereon, the instructions when executed by a computer implementing steps of any methods discussed above.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
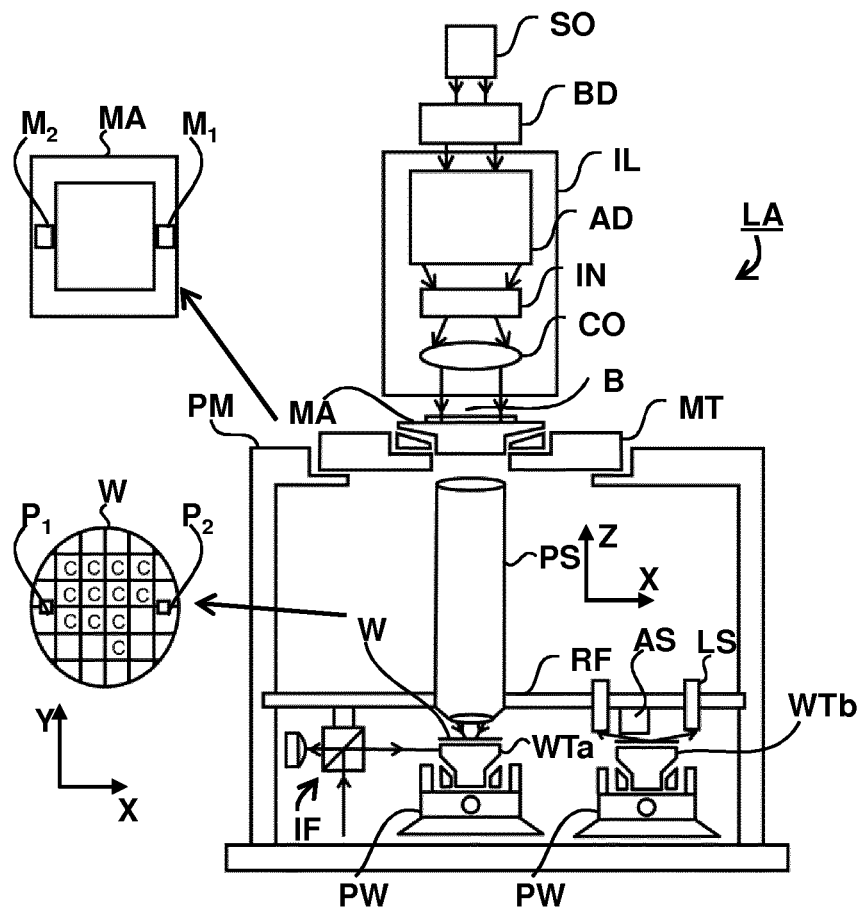
FIG. 1 schematically depicts a lithography apparatus according to an embodiment.

FIG. 1 schematically depicts an embodiment of a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen depending on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line-end pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
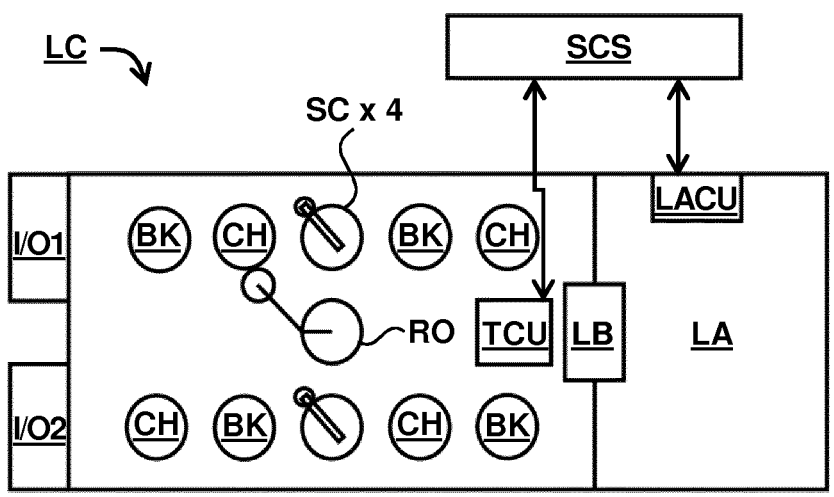
FIG. 2 schematically depicts an embodiment of a lithographic cell or cluster according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

The technology node is getting smaller and the design patterns more complex, so the patterning process inevitably prints undesirable patterns or defects on a wafer. As such, several process and patterning recipes related to, for example, a pre-OPC process, a defect detection process, a pattern verification process, a retargeting process, etc. of the patterning process should be improved. For such improvements, thousands patterns on a chip may be evaluated. With node scaling, design rules to enable design checks and retargeting have become extremely complex leading to advent of pattern-based rules for improved pattern manageability and pattern identification in, for example, OPC applications.

Existing pattern recognition or pattern searching approaches enables a user to define a desired pattern as an exact replica of what they expect to find. The desired pattern can be defined with a varying number of degrees-of-freedom (e.g., shape, size, edge roughness, etc.) related to a feature of a pattern such that similar patterns can be searched in a full chip layout. When executing a pattern search function to scan a design layout (interchangeably referred as a field pattern) for patterns matching a desired pattern (also referred as a search pattern), the existing algorithms become too expensive once they breach a certain inflection point (or threshold) in terms of number of patterns to be searched.

The existing pattern matching methods or algorithms have several limitations including overly restrictive in defining a fuzzy pattern (e.g., a search pattern), where a search function only detects or scans for all of what is desired to be found in a full-chip. Topological differences between the desired search pattern and the field layout pattern are too tightly bound resulting in the user having to create additional patterns to compensate for inefficiency and inflexibility in definition of the search pattern, or to develop additional conditions or software components to bridge the gap in search results due to limitations related to definition of search patterns.

The search algorithms or methods, for example, for OPC purposes are deemed as too slow particularly when pattern counts increase beyond, for example, thousands thereby limiting the number of patterns a user can have in a pattern library.

The present disclosure provides an improved search capability of pattern searching in terms of, for example, greater flexibility when searching for similar patterns, the ability to control topology definition to a finer degree (e.g., not restrictive of exact shape and size or fixed set of features), and faster execution than other current approaches even at a high number of patterns.

Figure 3A:
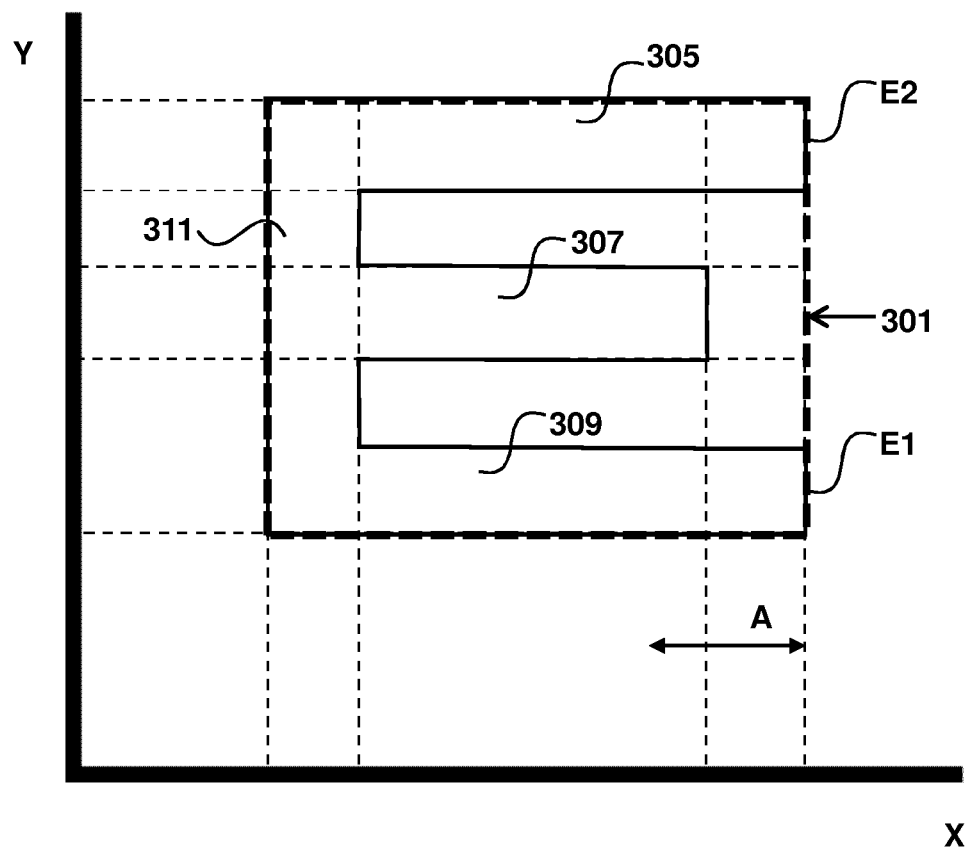
FIGS. 3A-3C are example pattern definitions associated with a search pattern according to an embodiment.
Figure 3B:
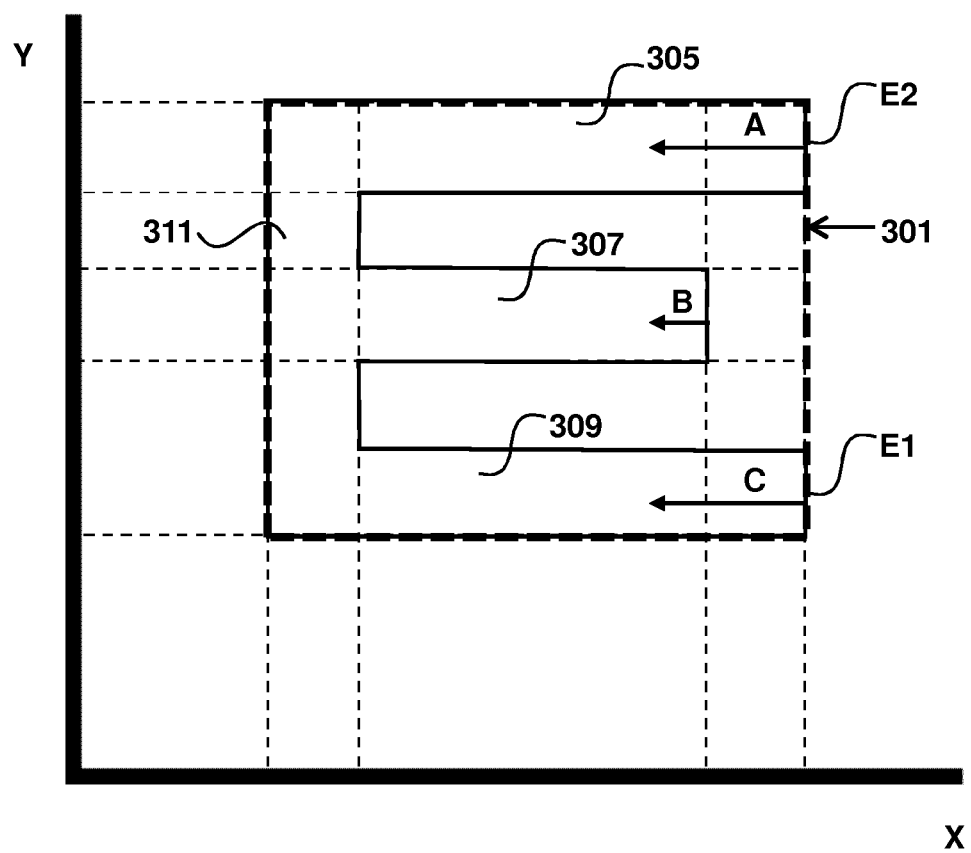
Figure 3C:
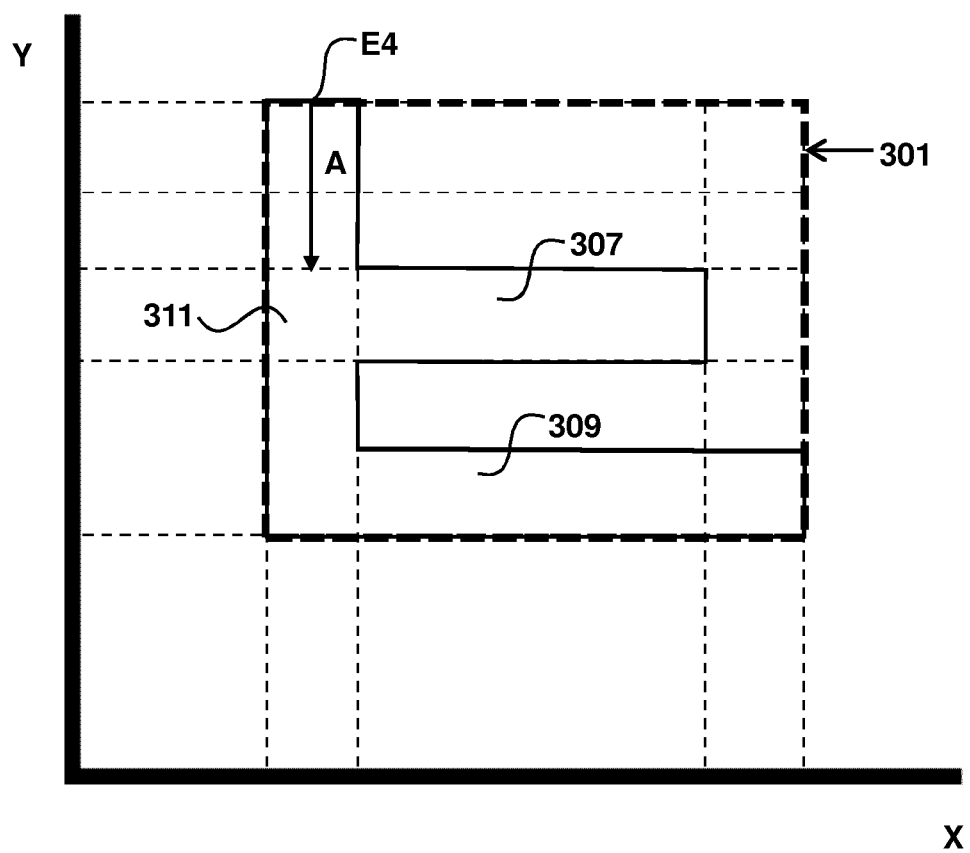

FIGS. 3A-3C are example pattern definitions (also referred to as conditions or specifications) associated with a search pattern and related issues from using current tools. In FIG. 3A, a grid-based search is provided, where constraints related to features such as 301, 307, 309, and 311 of a pattern (e.g., an E-shaped pattern) are defined with respect to a grid. Further, the pattern has a boundary 301 that further limits the search boundaries. Such grid-based definition do not have a per-edge control over pattern conditions. For example, it is not clear whether condition "A" applies to edges "E1" of the feature 309 or "E2" of the feature 305. So, for example, if the condition "A" indicates move or displace an edge by certain amount, then it is unclear whether edge E1 or E2 should be moved during the search process. Thus, when finding or comparing condition "A" with patterns in a field pattern, the search may result in incorrect patterns.

In FIG. 3B, edges (e.g., E1 and E2) of the pattern are coincident with the pattern boundary 301 and such edges cannot be moved or are fixed with respect to the pattern boundary 301. Moving such edges (e.g., E1 and E2) causes topological changes (e.g., shape changes) within the pattern boundary. For example, if edge E1 is move by an amount "C" (an example constraint) or edge E2 is moved by an amount "A", the topology of the pattern changes. Such topological changes are not acceptable in existing tools, thereby the search may not be performed or may result in incorrect search results. However, the present disclosure allows for such topological changes while still finding pattern match between the search pattern and the field pattern.

In FIG. 3C illustrates another example of pattern definition or constraint, where an edge E4 of the feature 311 is to be shifted by an amount "A" in a vertically downward direction (along y-axis) such that it becomes collinear with another parallel edge of the feature 307. However, such constraint is not allowed in existing tools since it also leads to topological changes.

The present disclosure discusses several methods for defining flexible search conditions determining a matching pattern between the search pattern and the field pattern based on the search conditions.

In general, one or more methods involves several steps or processes. For example, a method may involves a first process for setting up a search pattern database. The setting of the search pattern database involves applying different conditions to a plurality of pattern, where the conditions include, for example, a relative position between different features of a pattern and a tolerance band corresponding to the relative position.

In an embodiment, the method involves a second process in which a pattern search may be performed in a search space based on a search pattern selected from the search pattern database and conditions associated with the search pattern. In an embodiment, such search pattern may be defined by a user via an interface. The second process results in a first candidate patterns that may be further filtered based on a second set of conditions.

In an embodiment, the method involves a third process, where another pattern search may be performed based on the first candidate patterns and a bounding box. The search results in a second candidate patterns. Thus, the search space is progressively reduced, so that more number of rule checks (e.g., dimensions, co-ordinates, edge roughness, edge-to-edge placement, etc.) may be performed on second candidate patterns to find a good match or an exact match with the search pattern. As the checks are performed on reduced number of candidate patterns, more accurate search results are obtained in a fast and efficient manner (e.g., using less computation time and computation resources).

In an embodiment, the method may involve a fourth process, where a final check may be performed on the second candidate pattern. The final check may involve design rule checks, for example, EPE, CD, shape, or other geometric property checks to find a good match with the search pattern. Further additional patterns may be found by allowing a flexible pattern search to locate patterns having extra features thereby the search may find patterns that may not be exact pattern match with the topology of search pattern.

In an embodiment, methods of the present disclosure describe searching for patterns within a field pattern (e.g., a design layout) that match a search pattern. To provide efficient searching and to obtain reliable search results, appropriate search conditions must be defined. The methods involve defining conditions such as allowable displacements between any two edges including edges located at any of the pattern layers. The conditions may include edges that are independent of the pattern layer. The conditions may be defined with respect to the pattern's boundary edge as well. In case where all edges of the feature (of a search pattern) are attached to a condition, a faster search of patterns within a desired search space may be performed since the amount of results will be less compared to non-constrained search. Thus, in an embodiment, it may be desirable to define conditions for each edge of the feature or between edges of the feature. Furthermore, the methods provide increased flexibility in topological matching by allowing for floating (e.g., movable/resizable within a tolerance limit) polygons and edges. Furthermore, the methods enables a dynamic behavior of a bounding box as a function of what the user intended to match (e.g., the search pattern). Typically, the bounding box is a dimensionally-fixed construct (i.e., cannot be adjusted or modified in shape or size) that defines locations within a pattern where no feature(s) (other than features to be searched) is supposed to exist.

In an embodiment, the searching for patterns may be performed on a substrate or an image of the substrate to find patterns that satisfy certain search criteria such as a particular search pattern and conditions (or constraints) associated with the particular search pattern. In an embodiment, such search involves topological matching (e.g., matching relative positions between different features and outline of features) of the particular pattern with the patterns on the substrate. The term "substrate pattern," "field pattern," or "search space" may be used interchangeably herein to refer to a design pattern, as an example. However, the present disclosure is not limited to design pattern, a person skill in the art can apply similar search methods for search space comprising a pattern on the substrate that may be obtained from an image of a printed substrate or a simulated pattern of the substrate. In an embodiment, the particular search pattern may include one or more features which are compared with, for example, thousands of patterns (or features therein) of the field patterns. Then, field patterns that satisfy the search criteria constitute as candidate patterns for further search, e.g., for patterns matching additional search criteria associated with a bounding box (explained later in the disclosure). The candidate patterns may be interchangeably referred as "feasible patterns," "search result," "feasible set," or "solution space."

A step-by-step search based on different search criteria progressively narrows down the search space leading to faster execution of the search method or algorithm. For example, the methods allow an execution time of N*log(N), while the convention methods have a higher execution time such as $N^2$, $c^N$, or higher. Furthermore, one or more processes of the search algorithm or method maybe distributed based on a distribution architecture across one or more processors (e.g., one or more of processors 104 of the computer system 100) to further expedite the search.

Figure 4:
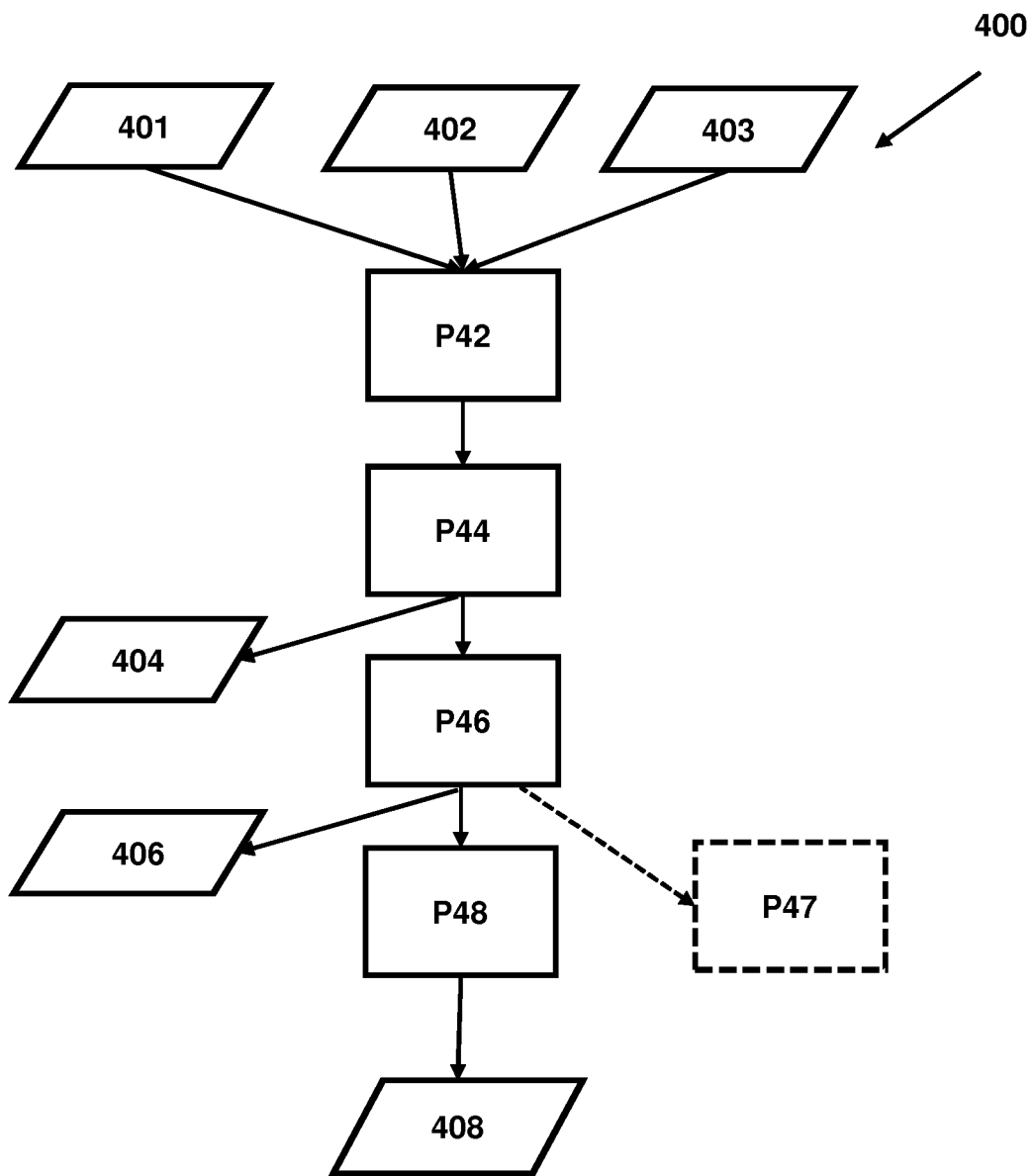
FIG. 4 is a flow chart of a method for determining candidate patterns from a set of patterns of a patterning process according to an embodiment.

FIG. 4 is an example flow chart of a method 400 for determining candidate patterns from a set of patterns of a patterning process, according to an embodiment. The method 400, in process P42, involves obtaining (i) a set of patterns 401 of a patterning process, (ii) a search pattern 402 having a first feature and a second feature, and (iii) a first search condition 403 comprising a relative position between the first feature and the second feature of the search pattern. The first feature may be present in a vicinity of the second feature (e.g., inside a region of interest). In an embodiment, the second feature is adjacent to the first feature.

In an embodiment, the set of patterns 401 refers to patterns corresponding to a patterning process and a space within which a search is performed using the search pattern. The set of patterns can be interchangeably referred as "search space" or "field pattern." In an embodiment, the set of patterns may be represented as an image of patterns obtained from a printed substrate and/or simulated patterns on the substrate. In an embodiment the set of patterns may be extracted from the image of patterns. In an embodiment, the set of patterns represented in a search friendly format such as a string or a relational database table. In an embodiment, the set of patterns corresponding to the printed substrate is obtained from a scanning electron microscope.

Figure 9:
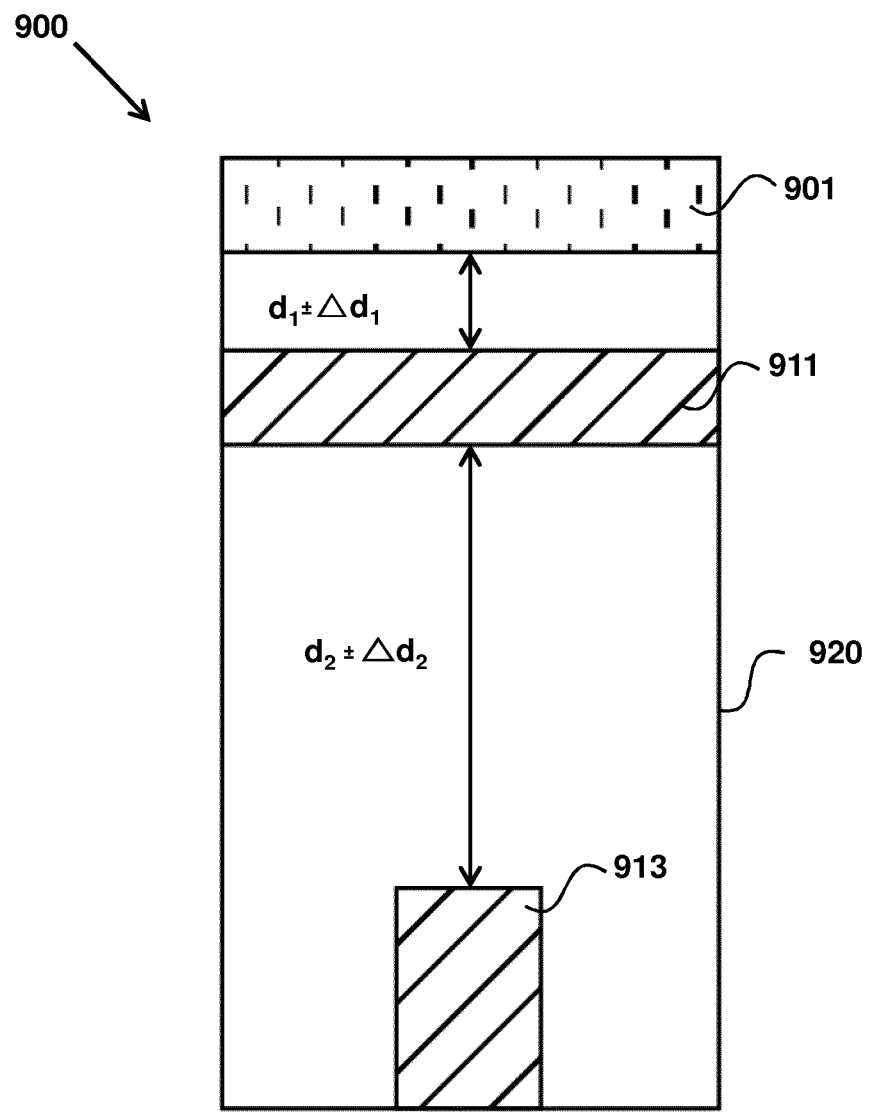
FIG. 9 is an example of search pattern having a plurality of features according to an embodiment.

The search pattern 402 may be any pattern of interest (e.g., a design layout or a design pattern therein or a user-defined pattern) intended to be matched with, for example, a substrate pattern (e.g., printed pattern or simulated pattern). The search pattern 402 may include a single feature (e.g., a contact hole, a bar, a line, etc.) or a plurality of features placed adjacent to each other. An example of search pattern is illustrated in FIG. 9. In an embodiment, the search pattern 402 is associated with a particular search condition (e.g., the search condition 403) to enable efficient filtering of potential matching candidates from the search space (e.g., an image of the printed substrate). In an embodiment, the search pattern 402 (e.g., design layout) may be stored in a database and retrieved on demand. In an embodiment, the search pattern 402 may be stored and/or provided in GDS format or other appropriate format for searching.

In an embodiment, the search pattern 402 includes a plurality of features, where one or more of the plurality of features are on the same layer of a substrate and/or on different layers of the substrate. In an embodiment, the first feature and the second feature are on a same layer. In an embodiment, the first feature and the second feature are on different layers. For example, a first feature (e.g., contact hole) may be on a first layer and a second feature (e.g., another contact hole or a bar) may be on a second layer of the substrate. Thus, the present method allows matching patterns independent of the layers of the substrate.

The search condition 403 is any condition or constraint associated with one or more features of the search pattern 402. For example, the search condition 403 is a condition associated with associated with the first feature and the second feature adjacent to the first feature of the search pattern. In an embodiment, the search condition includes a relative position between elements of the first feature and the second feature of the search pattern. In an embodiment, the relative position may be in a horizontal direction, vertical direction and/or angular direction. In an embodiment, the elements of the feature comprises edges and/or vertex of the features. In an embodiment, an edge of a feature may be associated with one or more constraints. For example, a first edge of the first feature may be associated with a horizontal constraint with a first edge of the second feature, and the first edge of the first feature can be associated with another constraint with a first edge of the third feature. In an embodiment, the search condition 403 may be a distance (e.g., 20 nm) between an edge of the first feature and an edge of the second feature.

In an embodiment, the search condition 403 may be a set of conditions associated with a plurality of features of the search pattern, for example, an edge of the first feature and an edge of the second feature of a design pattern. In an embodiment, the search pattern 402 may be stored and retrieved from a database (e.g., memory of the computer system 100 or remote serve accessible via the computer system 100) on demand. Similarly, the search condition 403 may be associated with the search pattern 402 and stored and retrieved from the same database. In an embodiment, the search conditions may be in form of a script (e.g., conditional statements as a python script) and a processor implementing the method 400 may be configured to receive the script.

Additionally or alternatively, the search condition 403 includes a tolerance limit associated with the relative position between elements of the features and/or a dimension of the features. The tolerance limit specifies how much the first feature is allowed to move relative to the second feature (or other constrained feature) without deviating from a desired functionality of the design pattern. The movement of the feature refers to a movement (e.g., shift or rotation) in a constrained direction (e.g., horizontal, vertical, angled, etc.). For example, the distance between an edge of the first feature and the second feature may be 20 nm±1 nm in a horizontal direction, thereby allowing the edges to move by 1 nm with respect to each other.

The method, in process P44, involves determining, via a processor (e.g., process 104 of the computer system 100), a first set of candidate patterns 404 from a set of patterns 401 that satisfies the search condition associated with the first feature and the second feature of the search pattern 402.

The first set of candidate patterns 404 are patterns (e.g., substrate patterns) within the set of patterns 401 that are a topological match with the search pattern 402 that satisfy a first search conditions. In an embodiment, the first set of candidate patterns 404 are considered a match if the search conditions are satisfied. For example, a search condition 403 may be relative positions between edges of the features of a pattern. Such first set of candidate patterns 404 may or may not have similar shapes, sizes, edge-to-edge, or other geometry related matching with the search pattern. Thus, additional conditional checks may be performed on the first set of candidate patterns 404 to find matching patterns within the set of patterns 401. The first set of candidate patterns 404 substantially narrows the search space to a subset. For such subset, additional matching, for example, point-to-point matching, shape, size, etc. within a bounding box may be performed to further narrow the search results.

In an embodiment, the search pattern 402, the first search condition 403 and the patterns in the set of patterns 401 may be represented in a string format, which allows string based comparison and search. Such string based search also reduces the runtime of the search algorithm or the method.

In an embodiment, features of the search pattern 402 and the candidate pattern (e.g., a first or a second set of candidate pattern) may be identified via parsing the search pattern and the candidate pattern. In an embodiment, parsing is an algorithm configured to identify objects of interest (e.g., a feature) in a relatively large search space. Upon parsing, a file may be generated that contains information such as location, size, shape, etc. related to the objects of interest. Further, the parsed information may be converted in a string, for example, via hashing. A string representation of the information enables faster comparisons between information (e.g., a feature of a search pattern and a feature of a field pattern).

The method, in process P46, involves obtaining a bounding box 406 around the search pattern 402 and a second search condition associated with the bounding box 406 and a feature of the search pattern 402. In an embodiment, the bounding box 406 may be obtained, for example, via a user interface of a drawing tool that allows the user draws a boundary (e.g., rectangular shaped) around the search pattern 402. In an embodiment, the bounding box may be defined based on co-ordinates of the outmost features of the search pattern 402.

In an embodiment, the bounding box 406 is defined as a closed boundary around the search pattern 402 to limit search to the features within the closed boundary. For example, FIG. 9 illustrates a bounding box 920 around the features 901, 911, 913 of the search pattern 900 limits the search to such combination of features. In an embodiment, during the bounding box based search, patterns having any additional feature other than the features (e.g., 901, 911, and 913) of the search pattern may be considered as non-matching patterns and thereby ignored.

In an embodiment, the second search condition is any condition associated with the bounding box 406 (e.g., 920) and one or more features (e.g., 901, 911, and/or 913) of the search pattern 402. In an embodiment, the second search condition is associated with the feature of the search pattern 402 that is closest to the bounding box 406. In an embodiment, the second search condition includes a relative position between an edge of a feature and an edge of the bounding box. In an embodiment, the relative position is a distance and/or an angle between the edge of the feature of the search pattern 402 and the edge of the bounding box 406. Alternatively or in addition, the second search condition may also include a tolerance limit associated with the relative position between elements of the feature of the search pattern 402 and the bounding box 406. The tolerance limit enables dynamic adjustment of the bounding box 406 with respect to the size of the features of the search pattern. So, even if certain features (of the search space) are not exactly of the same size as that of features of the search pattern, but still within the tolerance limit, a match can be found.

In an embodiment, for example in process P47, the bounding box 406 may be configured to dynamically change in size and shape based on conditions defined with respect to the bounding box. Then, the search may be performed based on such dynamically modified bounding box. For example, a first condition associated with a first feature and the bounding box, a second condition associated with a second feature and the bounding box. Such dynamic behaviour of the bounding box provided increased flexibility (compared to a fixed-bounding box) in search for patterns that do not exactly match, for example, the size and shape of the search pattern 402.

In an embodiment, a more flexible search may be performed with respect to the conditions associated with the bounding box 406. In such flexible search, patterns having extra features other than the features of the search pattern may also be identified as a matching pattern, even though the topology of the search pattern and the substrate pattern is different due to the extra feature. In an embodiment, patterns with such extra features may represent a fault or defect and such pattern may be of interest, for example, in fault identification or classification. An example result of such search is illustrated and discussed with respect to FIG. 13.

The method, in process P48, involves determining, via a processor (e.g., process 104 of the computer system 100), a second set of candidate patterns 408 from the first set of candidate patterns 404 that satisfies the second search condition associated the bounding box 406.

In an embodiment, the determining of the second set of candidate patterns 408 involves comparing one or more parameters of a feature of the search pattern 402 and corresponding one or more parameters of a feature of the set of patterns 401; and selecting, based on the comparison, a subset of patterns from the first set of candidate patterns 404 excluding patterns with topological mismatch. A topological mismatch refers to patterns having features that do not have similar or exact shape as features in the search pattern. For example, a pattern having an extra feature between two features of search pattern may be excluded, since the extra feature changes the topology of the search pattern.

In an embodiment, the one or more parameters includes at least one of: an edge of the feature, size of the feature, and topology of the feature. For example, a parameter may be a geometric parameter such as a length of an edge of the feature, edge roughness of the feature, CD of the feature, etc. of a search pattern may be compared with parameters corresponding to a feature of the field pattern. The comparison may involve computing a difference between the parameters of the two features and determining if the difference breaches (e.g., greater than or less than) a threshold value. In response to the difference not breaching the threshold value, a match between the search pattern and the field pattern is said to be found, otherwise a match is not found.

As mentioned earlier, the bounding box 406 may have a dynamic behavior, where a size and/or shape of the bounding box 406 may be modified/adjusted. In an embodiment, the determining the second set of candidate patterns 408 further includes adjusting the bounding box 406 around the search pattern 402 based on a size of the feature of the second search condition, and determining a second set of candidate patterns 408 from the first set of candidate patterns 404 from a set of patterns 401 that satisfies the second search condition associated the adjusted bounding box. In an embodiment, the adjusting of the bounding box is limited by the tolerance limit associated with the first search conditions, the second search condition, and/or parameter of the feature.

In an embodiment, the adjusting the bounding box 406 includes increasing and/or decreasing the size of the bounding box relative a size of the feature of the field pattern. In an embodiment, an amount of increase and/or decrease in size of the bounding box is within the tolerance limit associated with the relative position between elements of the feature and the bounding box.

Furthermore, as mentioned earlier, the search pattern 402 can include a plurality of features. The plurality of features may be on the same layer of a substrate or different layers of the substrate. In an embodiment, when performing the comparison (e.g., within the bounding box) between the search pattern and the field patterns, only the features of the search pattern are compared while space between the features may be considered empty. As such, when an extra feature exists between the features of the search pattern 402, then that portion of the field pattern may be considered as a mismatch or not a match with the search pattern.

Figure 5:
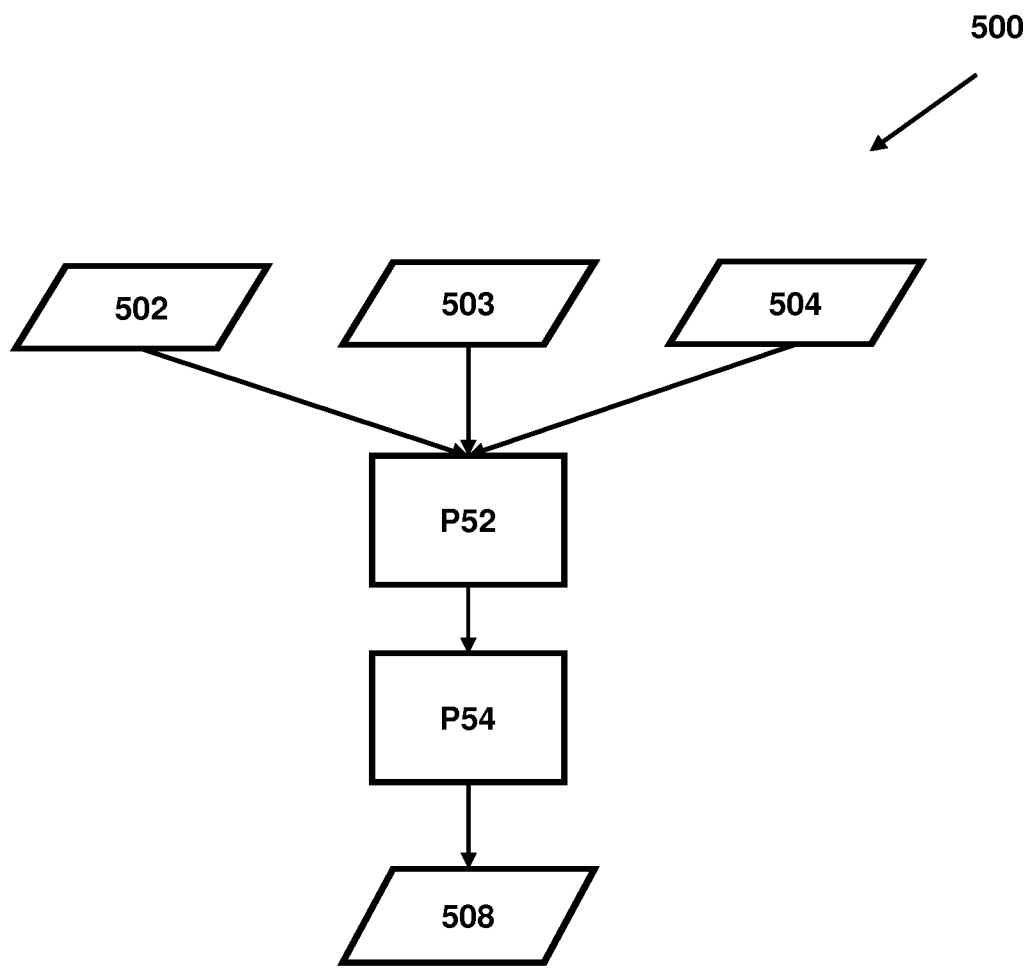
FIG. 5 is a flow chart of another method for determining candidate patterns from a set of patterns of a patterning process according to an embodiment.

FIG. 5 is another example flow chart for a method of determining a matching pattern. The method 500, in process P52, obtaining (i) a first set of candidate patterns 502 from a set of patterns (e.g., 401) based on a first search condition associated with features of a search pattern (e.g., 402), (ii) a bounding box 503 around the search pattern, and (iii) a second search condition 504 associated with the bounding box and a feature of the search pattern.

In an embodiment, the obtaining of the first set of candidate patterns 502 involves configuring a processor (e.g., 104) to receive the patterns 502. In an embodiment, the first set of candidate patterns 502 may be generated on a different processor in a similar manner as discussed with respect to process P44 of the method 400 and transmitted via a network to the process (e.g., 104). Furthermore, the bounding box 503 (similar to bounding box 406) may be obtained, as discussed above, in process P46. In addition, the second search conditions 504 may be obtained, for example, via an interface configured to input constraints on the search pattern (e.g., 900 of FIG. 9) and the bounding box 503 surrounding the search pattern. The second search conditions 504 are similar to that discussed in method 400.

Further, the method 500, in process P52, involves determining, via the processor (e.g., processor 104) a second set of candidate patterns 508 from the first set of candidate patterns based on the second search condition. In an embodiment, the process P52 is similar to the process P48 discussed above. An example of such search is illustrated with respect to FIGS. 10-12, discussed later in the disclosure.

In an embodiment, the determining of the second set of candidate patterns 508 involves comparing one or more parameters of a feature of the search pattern and corresponding one or more parameters of a feature of the set of patterns; and selecting, based on the comparison, a subset of patterns from the first set of candidate patterns 502 excluding patterns with topological mismatch. In an embodiment, the comparison involves comparing at least one of: an edge of the feature, size of the feature, and topology of the feature, as discussed earlier in P48. In an embodiment, the selection of the subset is based on such comparison between the edges, size, topology and/or other factors so that patterns having similar feature characteristics as search pattern are selected. In an embodiment, the selected patterns may or may not be an exact match with the search pattern.

Figure 6:
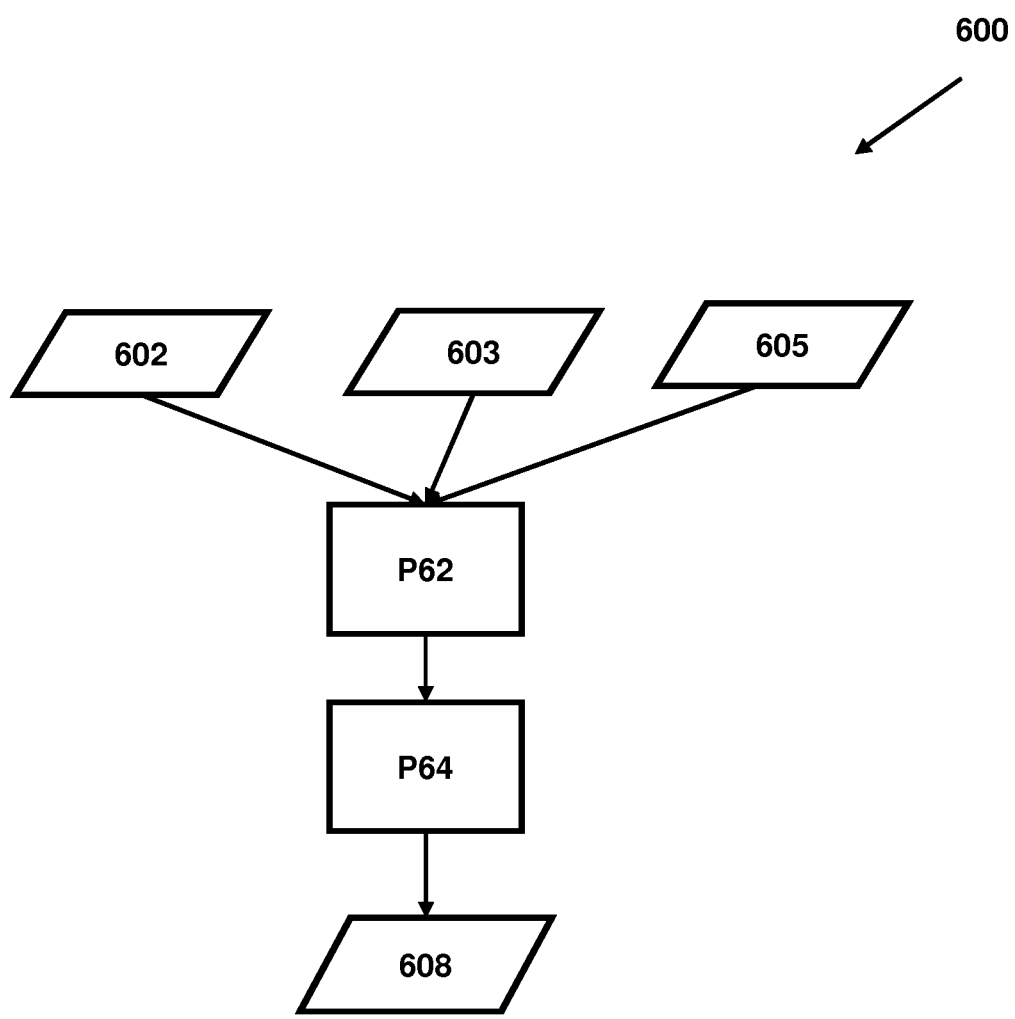
FIG. 6 is a flow chart of yet another method for determining candidate patterns from a set of patterns of a patterning process according to an embodiment.

FIG. 6 is another example flow chart for a method 600 of determining a matching pattern. Similar to the methods 400 and 500, the method 600 also involves determining a first set of candidate patterns and a second set of candidate patterns based on respective search conditions. In addition, the method 600 enables searching for patterns having extra features other than the features of the search patterns within the bounding box. As such, the method of 600 may provide additional patterns as search results, even if such patterns are not a topological match. Such flexible searching is highly desirable, for example, to allow improved optical proximity corrections (OPC).

The method 600, in process P62, involves obtaining (i) a first set of candidate patterns 602 from a set of patterns (e.g., 401) based on a first search condition associated with features of a search pattern (e.g., 402) (ii) a bounding box 603 around the search pattern, and (iii) a second search condition 605 associated with the bounding box and a feature of the search pattern.

The method 600, in process P64, involves determining a second set of candidate patterns 608 from the first set of candidate patterns 602 based on the second search condition, where the second set of candidate patterns 608 include a candidate pattern having an extra feature that is not included in the search pattern. An example search result is illustrated with respect to FIG. 13, discussed later in the disclosure.

In an embodiment, the determining the second set of candidate patterns involves comparing one or more parameters of a feature of the search pattern and corresponding one or more parameters of a feature of the set of patterns, and selecting, based on the comparison, patterns from the first set of candidate patterns without excluding patterns with topological mismatch. Thus, method 600 is different from methods 400 and 500, as it allows user to detect extra patterns. In an embodiment, such method can be used for defect detection and/or prevention, where the extra feature may constitute a defect.

In an embodiment, the extra feature can be defined as any feature adjacent to or in contact with a feature of the search pattern and within the bounding box. In an embodiment, the extra feature is on a same layer or a different layer than the feature of the search pattern. In an embodiment, the extra feature is not associated with constraints relative to the features of the search pattern or the bounding box. Thus, according to an embodiment, the search result includes a pattern that are not associated with a search condition (e.g., the first search condition or the second search condition).

Furthermore, as mentioned earlier, the search pattern can includes a plurality of features. In an embodiment (e.g., methods 400 and 500), when performing the comparison (e.g., within the bounding box) between the search pattern and the field patterns, only the features of the search pattern are compared while space between the features may be considered empty. As such, when an extra feature exists between the features of the search pattern, then that portion of the field pattern may be considered as a mismatch or not a match with the search pattern. However, in an embodiment, the method 600 enables identifying portions on the field pattern having extra features to be a match with the search pattern. It can be understood by a person skilled in the art that such flexible search can also be implemented in other methods such as the methods 400 and 500 and without limiting the scope of the present disclosure.

Figure 7:
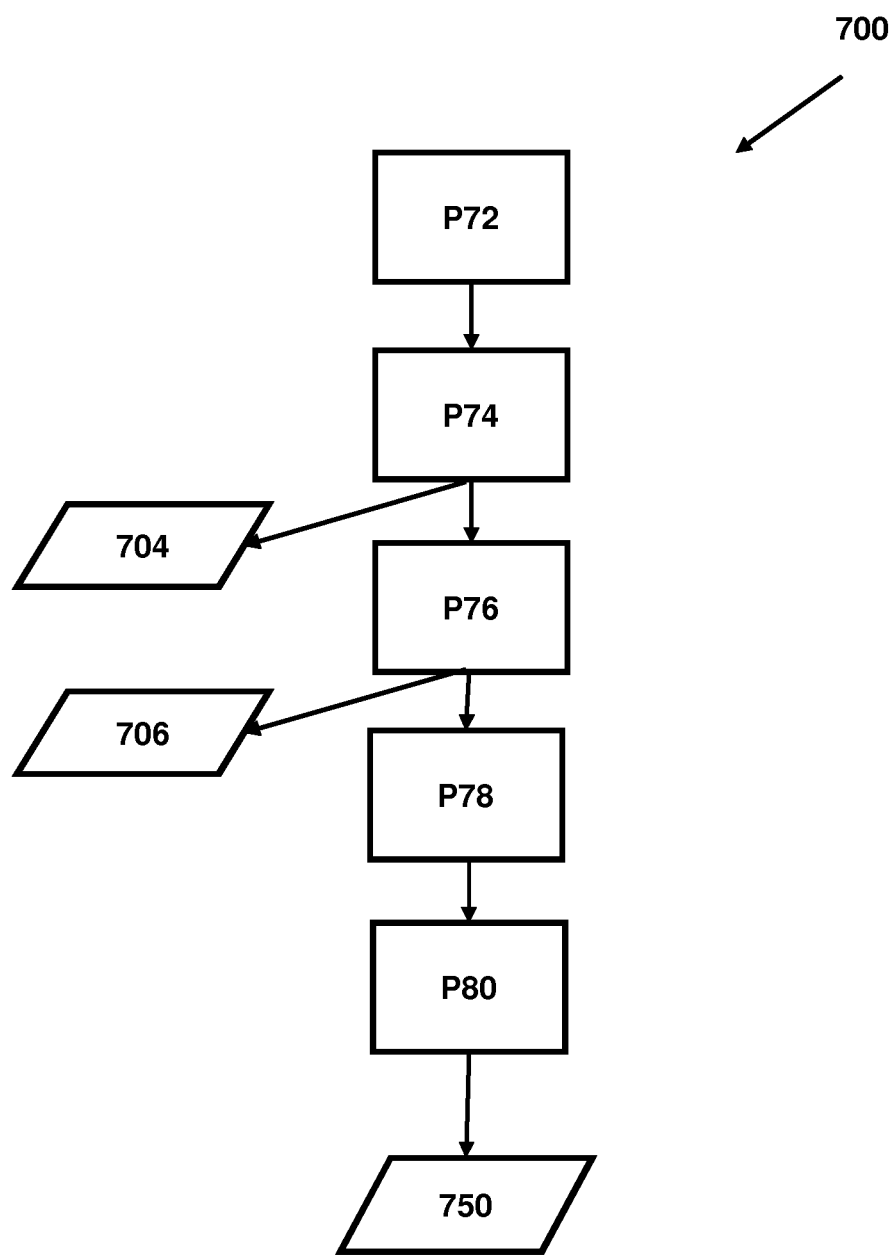
FIG. 7 is a flow chart of yet another method for determining candidate patterns from a set of patterns of a patterning process according to an embodiment.

FIG. 7 is an example flow chart for a method 700 of determining a matching pattern. The method 700, in process P72 involves applying, via a user interface, a first search condition between a first feature and a second feature of the search pattern (e.g., 402). In an embodiment, the applying the first search condition includes selecting an edge of the first feature and an edge of the second feature of the search pattern, assigning a distance between the selected edges, and/or assigning a tolerance limit to the distance between the selected edges. FIG. 9 illustrates an example of applying the first search condition such as between the edges of features 901 and 911 a distance of $d1 \pm \Delta d1$ is assigned, where $\Delta d1$ is a tolerance limit for distance d1. In another example, a distance $d2 \pm \Delta d2$ is assigned between the features 911 and 913, where $\Delta d2$ is a tolerance limit for distance d2.

In an embodiment, applying conditions involves defining conditional statements in a software between different features of the search pattern. For example, the aforementioned distance (d1 and d2) between edges of the features may be expressed as conditional statements which may be further used in a program to determine whether such conditional statements are satisfied or not satisfied. In an embodiment, conditional statements may be defined or converted to conditional statements based on user inputs via an interface configured to display a search pattern, select a feature and its elements of the search pattern, or other interactive functionality to define a condition/constraint. In an embodiment, such conditions may also be applied/defined through an application programing interface (API), which may be a python script API.

In an embodiment, a user may select, for example, two edges and provide a tolerance limit (i.e., a minimum and a maximum difference) between the selected edges. For example, a first edge of a first feature and a first edge of a second feature may be selected within a search pattern. Then, a distance between the edges may be assigned along with a minimum and maximum allowable variation in the distance between the selected edges. Similarly, a distance (e.g., CD) between two edges of the same feature may be defined. Further, these distances and the tolerance limit serve as the search conditions, where the field pattern is scanned for patterns satisfying such distance and tolerance limit.

The method 700, in process P74, involves determining a first set of candidate patterns 704 from a set of patterns based on the first search condition. In an embodiment, the first set of candidate patterns 704 are an example of the candidates 402, 502, or 602 discussed earlier. The determining of the first set of candidate patterns 706 is similar to the process P44 of method 400.

Further, the method 700, in process P76, involves drawing a bounding box 706 around the search pattern. In an embodiment, the bounding box 706 is an example of the bounding box 503 or 603 discussed earlier. Another example of the bounding box 706 such as 920 is illustrated in FIG. 9. In an embodiment, the bounding box 706 may be obtained as a user input, a script readable by a computer program, or other ways of representing information. In an embodiment, the bounding box 706 is drawn by a user via a user interface around a search pattern. For example, in FIG. 9, a user draws a rectangular bounding box 920 around the features 901, 911, and 913. Such bounding box 920 provides a structure for defining additional limitations to be defined to further filter out pattern from the first set of candidate patterns.

The method 700, in process P78, involves applying a second search condition between the first feature or the second feature, and the bounding box. In an embodiment, the second search condition may be applied in a similar manner as the first search condition, discussed in process P72.

The method 700, in process P80, involves determining a second set of candidate patterns 750 from the first set of candidate patterns based on the second search condition, wherein the second set of candidate patterns include a candidate pattern having an extra feature that is not included in the search pattern. In an embodiment, process P80 is similar to process P64, discussed earlier.

In an embodiment, the search patterns used in the methods 400, 500, 600 and 700 may be generated according to the method 800 discussed below and stored in a database to be accessed, for example, via a network, or other data retrieval techniques during the execution of processes of the methods 400-700.

Figure 8:
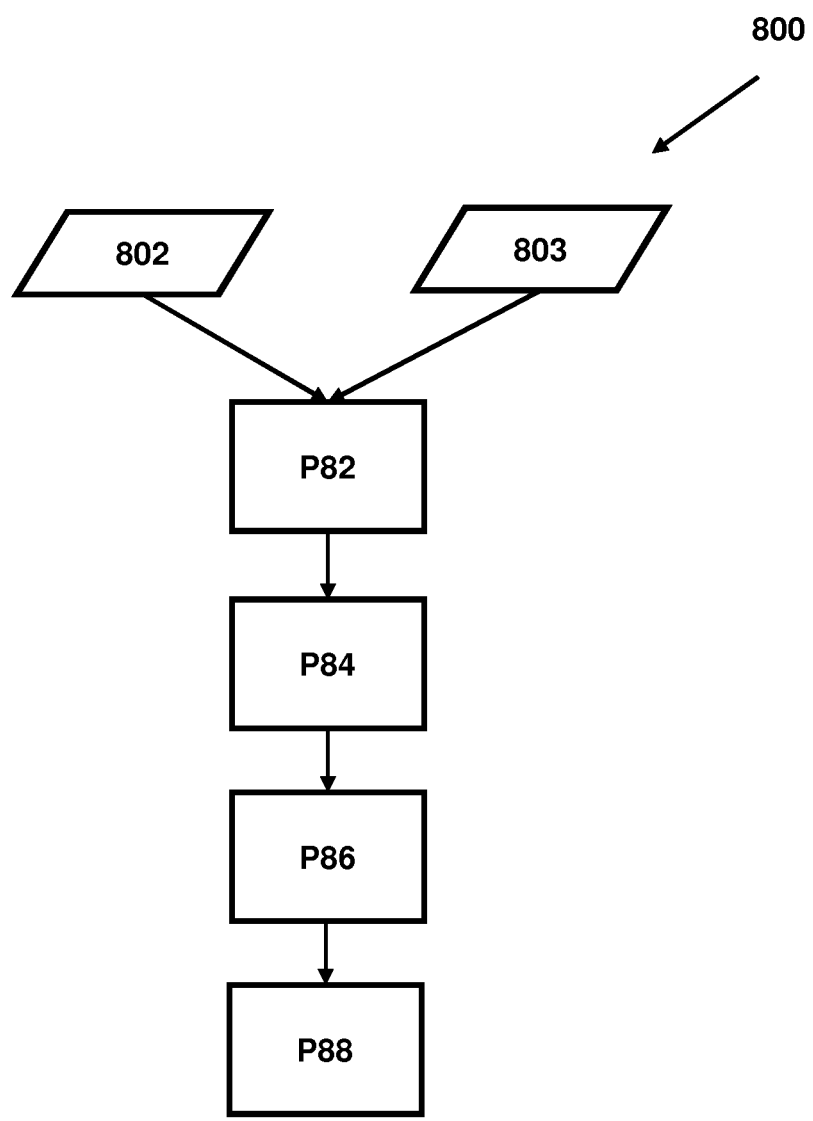
FIG. 8 is a flow chart of a method for generating search pattern according to an embodiment.

FIG. 8 is an example flow chart of method for generating a search pattern database. The method, in process P82, involves obtaining a set of patterns 802. In an embodiment, a pattern of the set of patterns 802 includes a plurality of features. In an embodiment, the set of patterns 802 includes a plurality of patterns, for example, a first pattern having a first plurality of features and a second pattern having a second plurality of features. The set of patterns 802 can be a design pattern, a user defined pattern, or any other pattern such as frequently occurring in process patterns or less frequently occurring patterns like defects.

Further, process P84 involves applying a set of conditions 803 (also referred as constraints) to the set of patterns to generate a set of search patterns, where a search pattern is a pattern within the set of patterns 802 associated with a search condition. In an embodiment, the conditions 803 may be applied in a similar manner as discussed in process P72 of method 700. In an embodiment, the set of conditions 803 includes a plurality of conditions 803. For example, a first set of conditions associated with the first pattern of the set of patterns 802, a second set of conditions associated with the second pattern of the set of patterns 802, and so on. As such, there is a possibility that one or more conditions 803 may be similar or different resulting in a conflict.

After assigning conditions, process P86 involves evaluating whether a conflict exist between one or more search conditions associated between different patterns. For example, a conflict between one or more features of a first search pattern and one or more features of a second search pattern. Such conflict check ensures consistent and unique conditions exist across different patterns. It can be understood by a person skilled in the art that not each pattern of the set of patterns may printed on a substrate, as such not all patterns of the set of patterns 802 may be found in the substrate pattern (or field pattern).

In an embodiment, the evaluating the conflicts includes identifying one or more features having same search condition or whether the search conditions exceed a predetermined threshold of the pattern of the set of patterns; and displaying the identified features having conflicting conditions.

Further, process P88 involves generating and storing the set of search patterns and associated set of search conditions for which no conflict exist. Such set of search patterns constitute the databased of the search patterns. One or more patterns may be selected and retrieved from the data base to perform a search on the field pattern.

FIG. 9 is an example of search pattern 900 having a plurality of features 901, 911, 913. As mentioned earlier, the features may be located on the same layer or different layer of the substrate and does not limit the scope of the present disclosure. In an embodiment, the features may be located on a first layer and/or a second layer of the substrate. For example, the first layer includes a first feature 901, and the second layer includes a first feature 911 and a second feature 911. In an embodiment, a first constraint or a first set of conditions may be include one or more distance between the features 901, 911, and 913. For example, a distance d1 and d2 may be a first set of conditions or constraints between the features. In addition, a tolerance limit may be assigned to one or more distances such as Δd1 and Δd2. Furthermore, the first set of condition may include a CD of the feature such as CD of the feature 913 is 48 nm; in addition, a tolerance limit may also be assigned such as ±5 nm. In an embodiment, such search pattern having the first set of condition may be stored in a database and may be selected for the database on demand.

In an embodiment, the search pattern may be surrounded by a bounding box 920. The bounding box 920 may be drawn such that the bounding box 920 encloses the features 901, 911 and 913. In an embodiment, a bounding box may be defined per layer. Furthermore, a second set of conditions or constraints may be defined with respect to the bounding box 920. Depending on the second set of conditions, the bounding box may be automatically adjusted to increase or decrease in size such as length (e.g., along x-direction or horizontal direction), and/or height (e.g., along y-direction or a vertical direction). In an embodiment, if there are no constraints assigned to the height or length, then the bounding box may be automatically adjusted to a reasonable size, for example, 1.2 times, 1.5 times, 2 times, etc. the originally drawn size.

In an embodiment, a further processing may be performed to convert the above pattern (e.g., size, location, conditions, etc.) related information to a machine readable format such as conditional statement, python script, etc. Such machine readable format enables searching, comparing, matching and/or determining relevant matching patterns within a search space such as a field pattern 1000 (in FIG. 10). In an embodiment, the search pattern 900 and the field pattern 1000 are exemplary visual representations of a pattern used to explain the concepts of the present disclosure. The format of the patterns 900 and 1000 does not limit the scope of the present disclosure.

Figure 10:
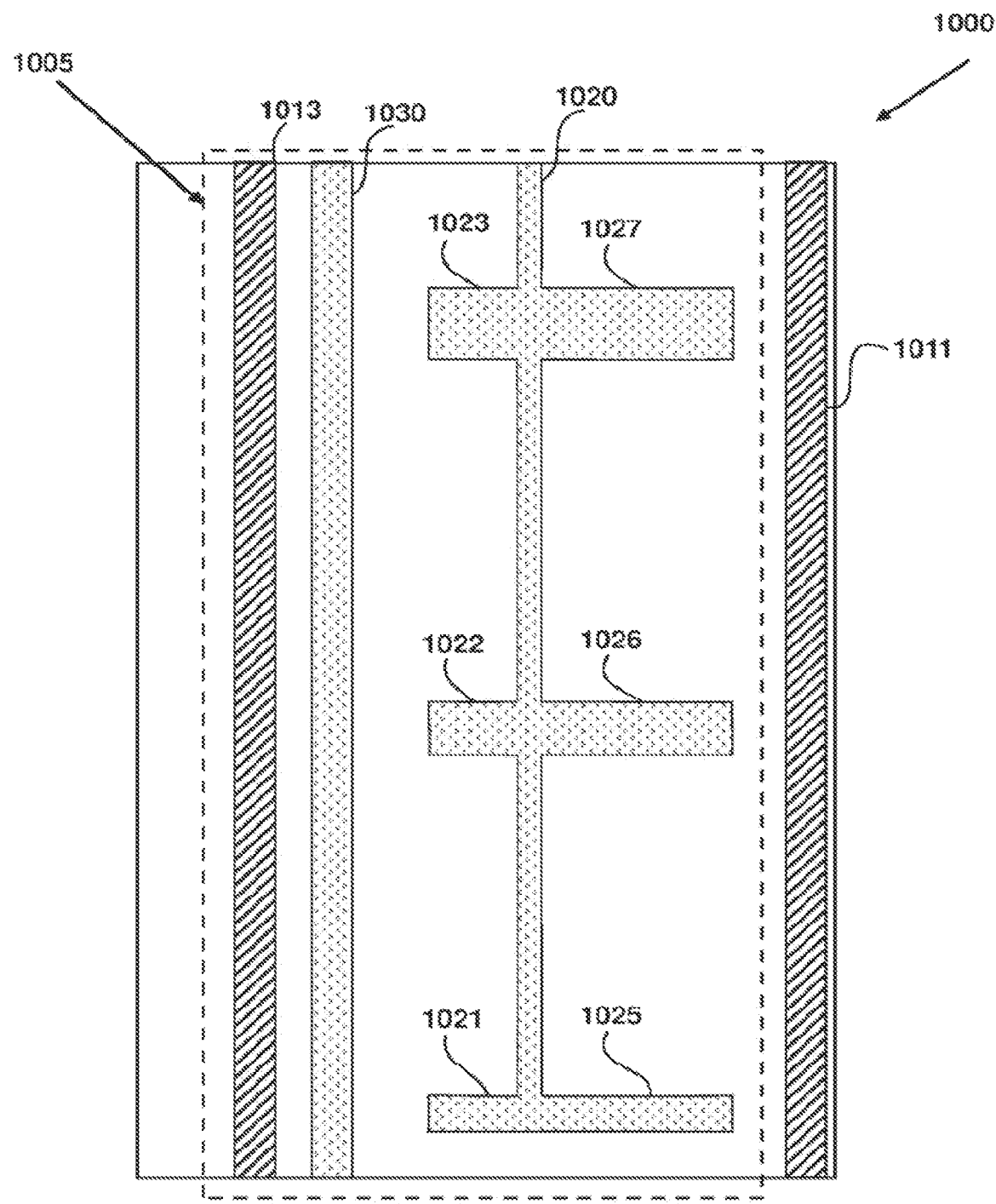
FIG. 10 is an example of a field pattern or a printed substrate pattern according to an embodiment.

FIG. 10 is an example of a field pattern 1000 or a printed substrate pattern. The field pattern 1000 includes a plurality of features such as features 1020 having sub-features 1021, 1022, 1023, 1025, 1026, and 1027 formed on a first layer. In an embodiment, the field pattern may be a substrate pattern obtained in the form of an image (e.g., SEM image) or in another data format (e.g., a string) representing the patterns on a substrate.

In an embodiment, a first set of candidates may be determined based on the first set of conditions defined in FIG. 9. For example, a processor may be configured (as discussed in methods 400-700) to search for patterns similar to the search pattern, particularly, having features 901, 911, and 913 while also satisfying the first set of conditions. Then, field patterns that satisfy such first set of conditions are extracted resulting in a reduced search space to, for example, region 1005. In an embodiment, although features 1021, 1022, 1023, 1025, 1026, 1027 have different sizes compared to the feature 913 of the search pattern, such field pattern satisfy the first set of conditions in terms of, for example, relative positions with respect to adjacent patterns and corresponding tolerance limits, etc.

Once the first set of patterns is obtained, a second set of patterns may be determined based the bounding box and the second set constraints, as discussed with respect FIGS. 11A, 11B, 12 and 13. The below description of steps/processes is only exemplary and do not limit the scope of the present disclosure. A person of ordinary skill in the art may modify the steps, for example as discussed in methods 400-700, to obtain the second set of candidate patterns.

Figure 11A:
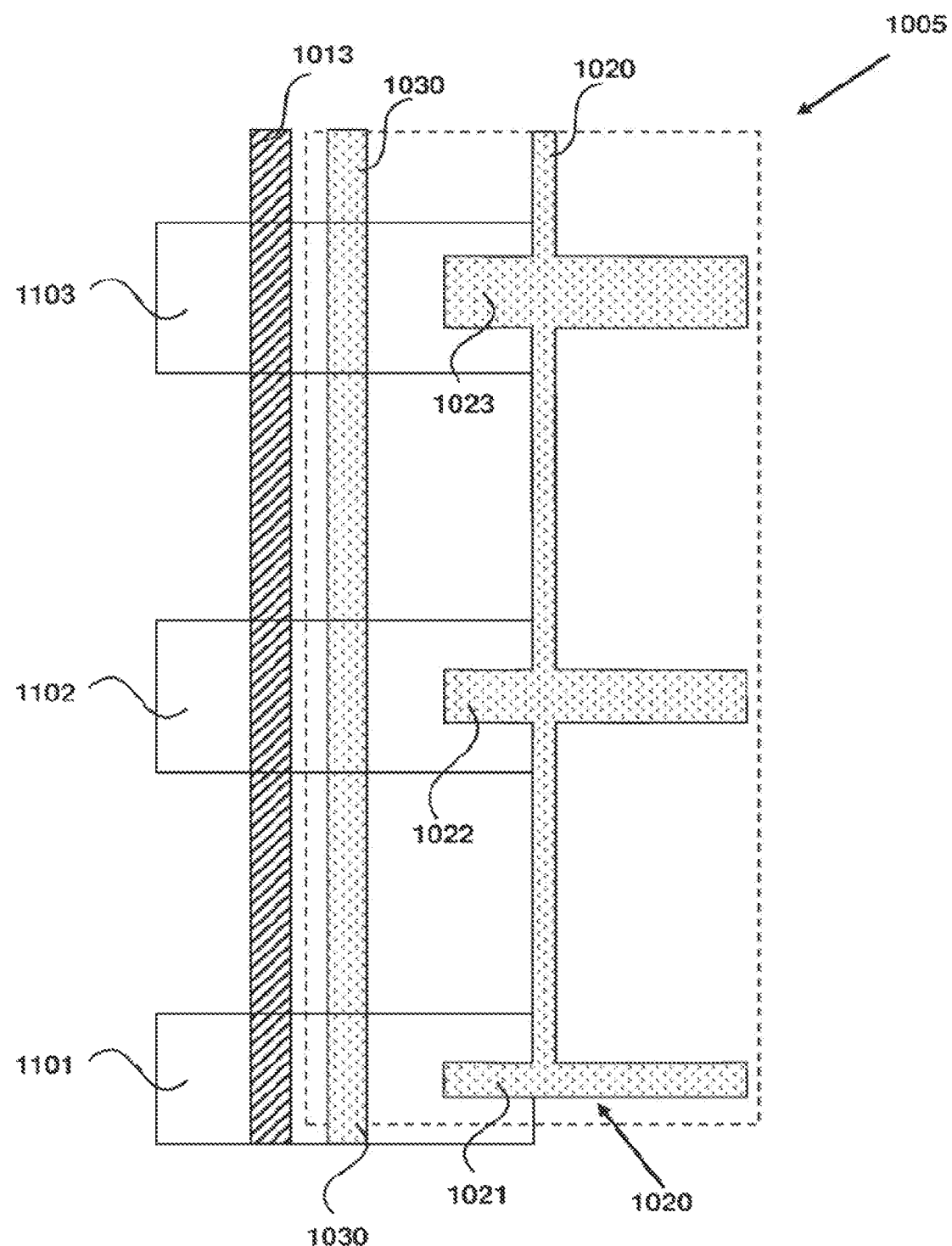
FIGS. 11A and 11B is snap shot of results of intermediate steps involved in determining a set of candidate patterns from the field pattern of FIG. 10 that match the search pattern of FIG. 9 according to an embodiment.
Figure 11B:
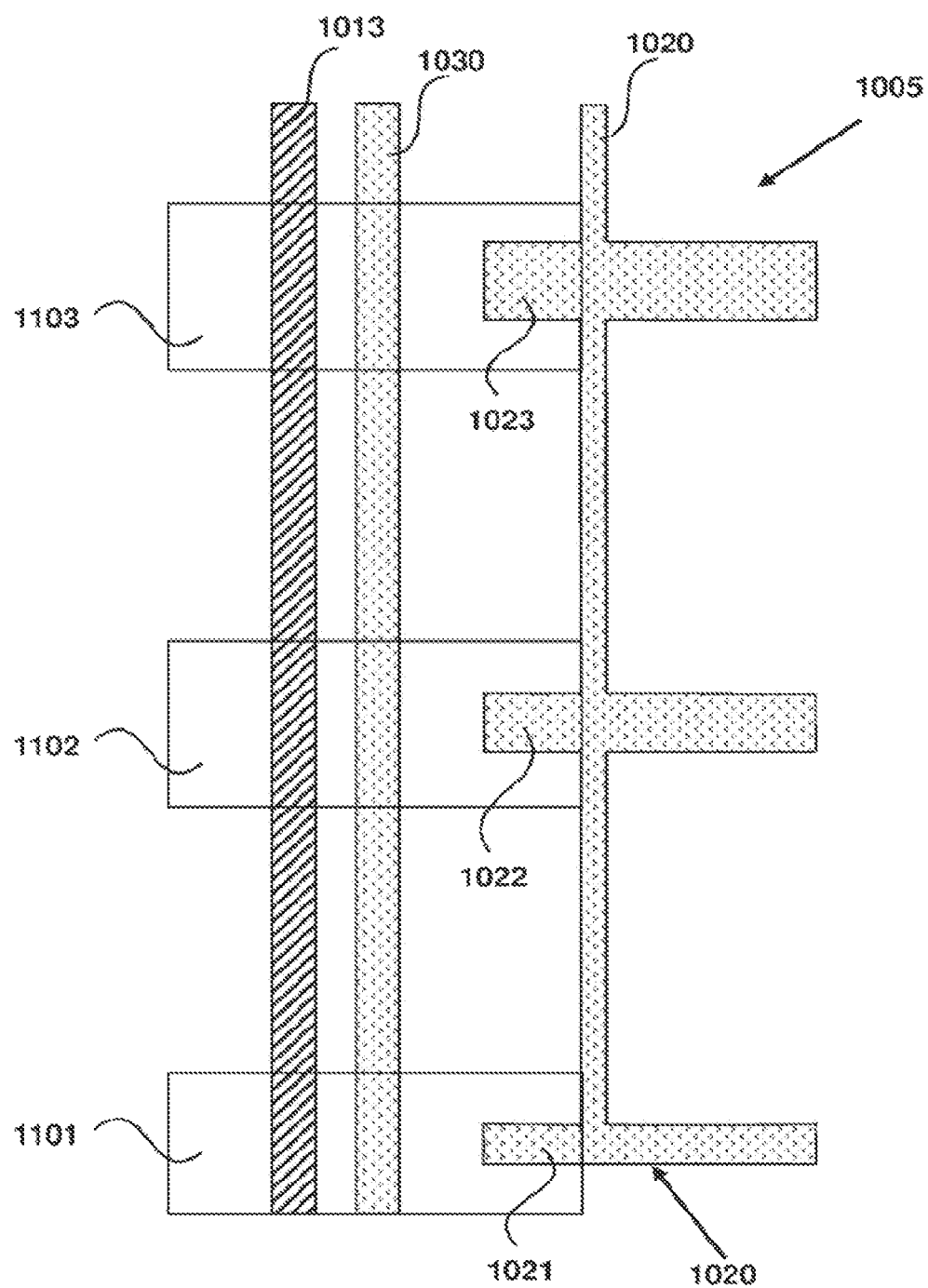

FIGS. 11A and 11B is snap shot of results of an intermediate steps involved in determining a second set of candidate patterns from the field pattern that match the search pattern. In an embodiment, a bounding box may be generated around one or more patterns of the field pattern that resemble the search pattern. In an embodiment, a first bounding boxes 1101 is generated around the patterns 1013, 1030, and 1021. A second bounding boxes 1102 is generated around the patterns 1013, 1030, and 1022. A third bounding boxes 1103 is generated around the patterns 1013, 1030, and 1023.

The one or more patterns were identified as the first set of patterns as discussed earlier. Within the bounding boxes, unique mapping may be established, where each feature (or polygon shape) in the search pattern is mapped to field pattern (or polygon shape). The bounding box may or may not be the same as defined in FIG. 9. For example, features 901, 911, and 913 are mapped to 1013, 1030, and 1021 (or 1022, and 1023).

Such bounding boxes (along with the second set of conditions) further reduces the search space, thereby improving the computation time during the search, matching, and comparison operation, since relatively less number of objects are evaluated from the field pattern. Such reduces search space makes the program efficient, particularly, given the fact that there can be potentially millions of patterns to evaluate. Thus, the present methods lead to faster execution of pattern search with less number of computational resources.

The bounding boxes 1101, 1102, and 1103 may be of same sizes or different sizes. In an embodiment, the bounding boxes are separated from each other and do not overlap. In FIG. 11A, the bounding boxes 1101, 1102, and 1103 are of similar sizes and shapes, however the bounding boxes 1101, 1102, and 1103 are not centered around the field patterns such as 1021, 1022, and 1023, respectively. In an embodiment, a height of the bounding boxes are not conditioned/constrained, thereby the height of the bounding boxes can be different from that defined in FIG. 9. Later in the process, these bounding boxes may be adjusted based on the second set of conditions/constraints that were defined between the features of the search pattern and the bounding box 900 in FIG. 9.

In an embodiment, a process (e.g., P48, P54, P64 or P80 of methods 400-700) may be configured to anchor the bounding boxes 1101, 1102, and 1103 around the field patterns of the first set of candidate patterns. Anchoring refers to establishing a reference position for the bounding box with respect to a pattern of the field pattern. For example, FIG. 11B illustrate that the bounding boxes are anchored with respect to a center of the patterns 1021, 1022, and 1023 as reference or set point. Once the anchor is established, the bounding boxes 1101, 1102, and 1003 are shifted with respect to such reference position to provide a search space for further filtering of the patterns of the field pattern may be performed, as shown in FIG. 11B.

The bounding boxes 1101, 1102, and 1103 (in FIGS. 11A and B11) are not associated with height (or y-direction) constraints, so these boxes are unconstrained in y-direction, but may be bounded or conditioned in x-direction (or horizontal direction) depending on the size of the patterns within the field pattern. Further, the second set of constraints may be applied to the bounding box to further reduce the search space of the field pattern. For example, the bounding boxes may be resized and further evaluation may be performed to determine whether the second conditions with respect to the features of the search pattern is satisfied.

Figure 12:
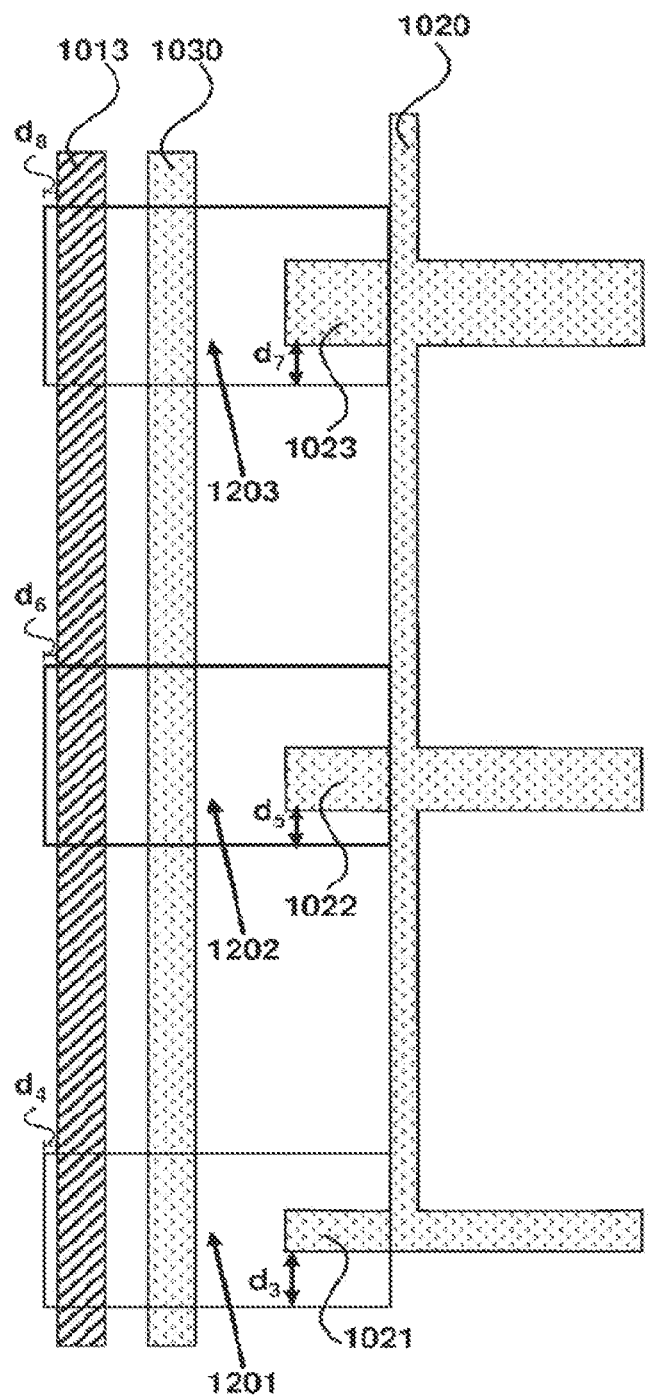
FIG. 12 illustrates an example adjustment of the bounding boxes of FIGS. 11A and 11B according to an embodiment.

FIG. 12 illustrates an example adjustment of the bounding boxes of FIGS. 11A and 11B. In FIG. 12, the bounding boxes 1201, 1202 and 1203 are resized versions of the bounding boxes 1101, 1102, and 1103, respectively. In an embodiment, the adjustment may be performed according to the process discussed in methods 400-700. In an embodiment, the adjustment of a bounding box may be based on the size of the feature within the bounding box, and/or the second condition (e.g., a distance between an edge of the feature and the bounding box). For example, features 1021, 1022, and 1023 are of different sizes (e.g., CD values are 45 nm, 48 nm and 64 nm respectively). Accordingly, the bounding boxes 1201, 1202, and 1203 are adjusted according to the size of the patterns 1021, 1022, and 1023, respectively. In addition (or alternatively), the adjustment may be based on the constraints. For example, a first bounding box 1201 may be adjusted based on distance d3 and d4 (and their corresponding tolerance limit) between the features (e.g., 901 and 913) of the search pattern 900 (defined in FIG. 9). The adjustment may involve adjustment of the width and/or height of the bounding box. Similarly, a second bounding box 1202 may be adjusted based on distance d5 and d6 (and their corresponding tolerance limit) between the features (e.g., 901 and 913) of the search pattern 900 (defined in FIG. 9). Similarly, a third bounding box 1203 may be adjusted based on distance d7 and d8 (and their corresponding tolerance limit) between the features (e.g., 901 and 913) of the search pattern 900 (defined in FIG. 9). In the above example, upon adjustments, the bounding boxes 1201, 1202, and 1203 have different sizes, e.g., 130 nm, 134 nm, and 150 nm, respectively, and the heights of each bounding boxes are the same. It can be understood by a person skilled in the art that the present disclosure is not limited to above example or aforementioned adjustment and any other adjustment based on the second conditions or first conditions may be determined.

In an embodiment, some field patterns within the bounding may not satisfy the second conditions (e.g., distances, tolerances, feature sizes, etc.), in which case, such patterns are considered non-matching patterns and filtered out of the search space.

Figure 13:
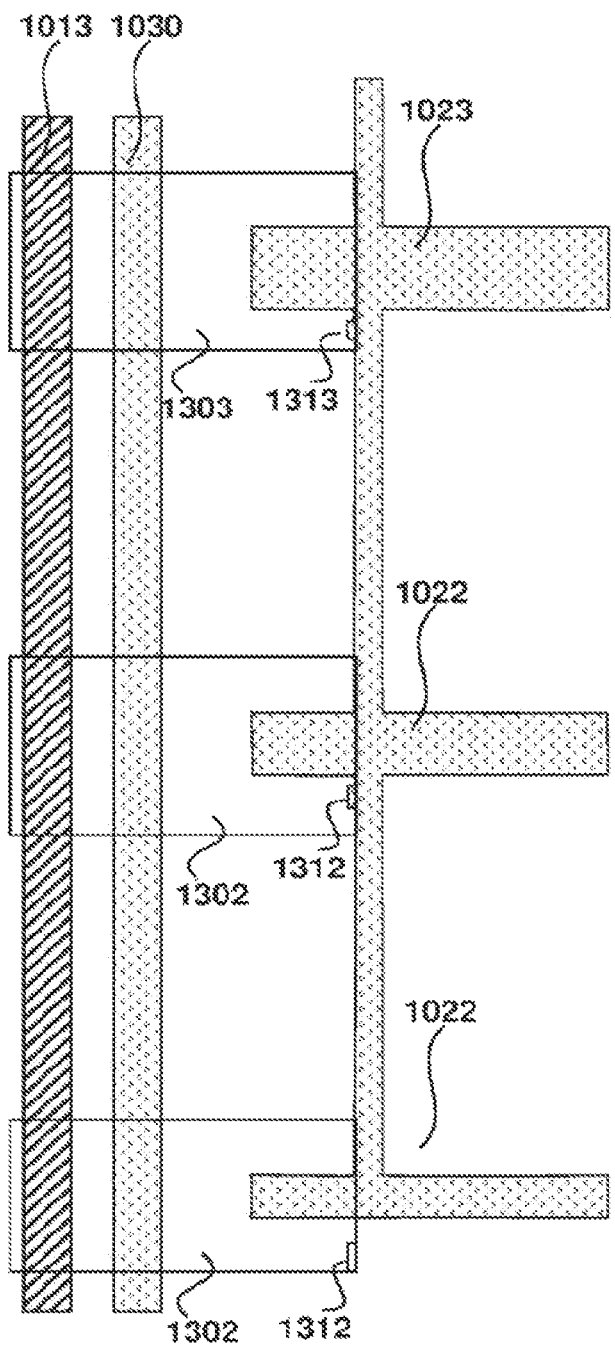
FIG. 13 is an example of search results where the second candidate patterns includes extra features according to an embodiment.

FIG. 13 is an example of search results where the second candidate patterns includes extra features (i.e., patterns other than the search patterns) within the bounding box. Such results may be obtained as discussed in process P80 of method 800. In an embodiment, the features within the bounding box may not map exactly with the features of the search pattern. For example, extra features 1311, 1312, and 1313 within the bounding box 1301, 1302, and 1303, respectively may not be mapped to the features (e.g., 901, 911, and 913) of the search pattern. The extra features are located within empty spaces between different features and adjacent to one or more features corresponding to the search pattern. The bounding boxes 1301, 1302, and 1303 have additional properties that allow such flexible search to locate extra patterns compared to, for example, the bounding boxes 1101-1103. Thus, depending on the dynamic behavior of the bounding box, different search results may be obtained.

The above methods have several advantage and provide improvements over state of the art. For example, in an embodiment, a method allows a user to define search conditions to include edges that are independent of a layer (of a substrate). Further, boundary conditions may be defined between any edge in the search pattern and a bounding box of the pattern. The bounding box related conditions are defined such that the bounding box (or even the features) may grow or shrink by a certain amount with respect to a reference that remains fixed in position. For example, the bounding box may grow horizontally or shrink horizontally. In addition, bounding box (or features within the bounding boxes) are allowed to shift within a set tolerance limit. Thus, the methods allow per-edge control by applying appropriate conditions between the edges of the features and the bounding box. For example, the bounding box should not only grow by 20 nm with respect to feature size, but also shift by 10 nm with respect to an edge of the feature nearest to the bounding box. Such flexibility is highly desired by designers to improve the patterning process via recipe or OPC changes based on the search results discussed above.

The above methods of searching for a desired pattern within a search space such as a design layout or printed substrate may have several applications including retargeting in a pre-OPC step, verification process, defect identification and prevention, or other application where pattern having particular specification are desired to be printed.

In an embodiment, the above methods may be used for retargeting process, which is a pre-OPC step. Typically, the retargeting process involves adjusting the edges of a pattern in a design layout to account for resist, etch and/or other processes variations in patterning process. For example, compared to a target specification, a square or contact hole may be increased in size, a line may be made slightly wider, etc. In an embodiment, the retargeting process is a global process in which if certain edges that meet specific conditions like width, space, y nm width (e.g., y=15 nm, 20 nm, 30 nm, . . . ), y nm space (e.g., y=5 nm, 7 nm, 10 nm, . . . ), etc. are found, then it may be desired to move such feature elements (e.g., edges) by a certain amount (e.g., within a tolerance limit) so that desired patterns are printed more accurately (e.g., closer to target specification). In an embodiment, such movement of edges may be a table based that involves a lot of two dimensionality (e.g., distances/width/height in x-direction and y-direction) in a design. Rules to move edges may be in the form of tables, which become complex multidimensional tables, and the present methods enable to efficiently execute and check rules in multiple tables in parallel. In highly complex areas of a design pattern or substrate pattern, retargeting (e.g., adjustment to edges) may not be applied correctly. However, it takes substantial effort to requalify or update a retargeting recipe that has to fit that particular local area having complex patterns. With the present methods, a particular pattern (e.g., a search pattern 900) may be searched to locate areas of retargeting error. The present method allows to fuzzy up the particular pattern (e.g., changes feature relationships/positions within a tolerance limit) in a way that a user can find the retargeting related pattern on a next or different design. When the pattern is found in the next design, a "pass through" operation may be performed. A pass through operation involves storing patterns (e.g., retargeting patterns/modified) on different layers, e.g., a pattern may be stored as a part of first layer for searching purposes and a second layer may include a final solution after defining retargeting recipe. In an embodiment, search using fuzzy pattern may involves identifying retargeting locations and then at the locations of the match, additional post processing on the match results (i.e., patterns at the locations of match). In an embodiment, the additional processing may involve, for example, applying specific retargeting or biasing edges, and/or blocking a pattern with the pattern of a pass-through layer (e.g., a first layer). Thus, the methods helps to better cover a current field pattern and appropriately direct the user to patterns and their locations where the retargeting recipe fails.

In an embodiment, the methods of the present disclosure may be used for pattern verification. Oftentimes, a process simulation is performed to predict patterns such OPC patterns or on a substrate, then verification is performed with respect to a desired pattern or pattern on a design layout to identify patterns with defects.

Further verification of predicted defective patterns may be performed on a printed substrate via a metrology tool (e.g., SEM). The metrology tool may or may not find such defects, or find other defects that are outside the scope of patterns identified in verification process. Missing out on certain defect in the verification process may be problematic, since such missed defect may be printed on the substrate and the process models used during the simulation and verification process may not be covered. In an embodiment, it may be desirable to adjust process parameters or process flow without having to change the process model or change a process recipe. Because such adjustment is time consuming and effort intensive to get a different model recipe. So the defective pattern identified from metrology tool (e.g., SEM image) may be patternized (e.g., convert them into a search pattern). During patternization of defective patterns (identified by data from metrology tool), the defective pattern may be tailored by addition conditions (e.g., relative position, tolerance limit, etc.) and such pattern may be used as search pattern. Such additional search pattern can be included in the verification process and the verification process may be supplemented with additional pattern search.

In an embodiment, the present methods may be used for defect prevention. During the patterning process in a fab, two types of inspections may be performed on a wafer. First, a guided inspection in a database or a wafer die via an inspection tool (e.g., SEM) to look for defects (e.g., a signal mismatch between a desired pattern image and a wafer pattern image) and flag patterns or locations with defects. Such flagging is usually good indicators as to predict what is going to happen on a next die or a next wafer. So, although such defect patterns though may outside of a simulation based pattern verification process will find. Some of these simulation based defect patterns may be nuisance or false defects (e.g., 40% or 50% of identified defect may be false or does not show manifest in wafer defect), while some are borderline defects or substantial defects. So, the present methods may be used to generate search for such defective patterns and further use the search patterns to identify locations on a wafer that may fail. Then, appropriate defect prevention measures such as OPC, retargeting may be taken.

As mentioned earlier, inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate.

Figure 14:
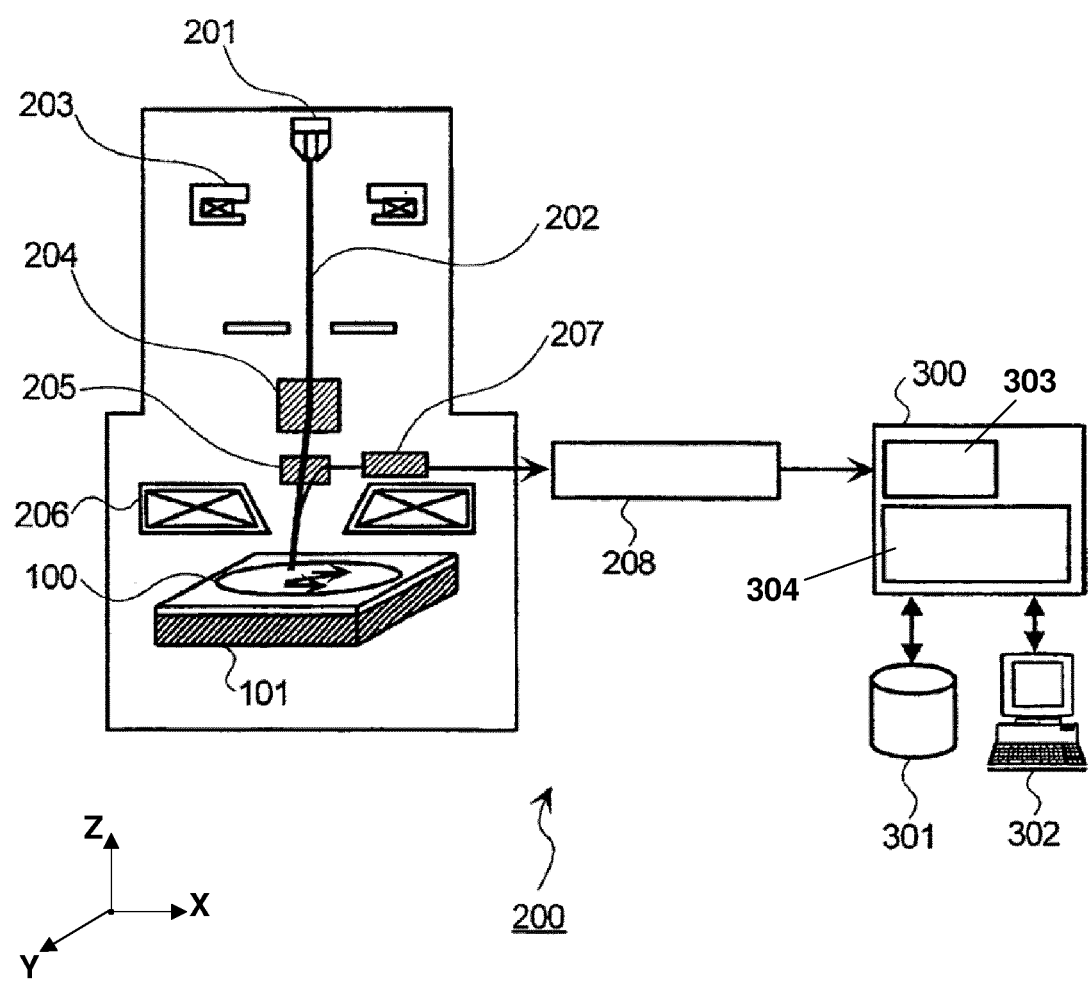
FIG. 14 schematically depicts an embodiment of a scanning electron microscope (SEM), according to an embodiment.

FIG. 14 schematically depicts an embodiment of an electron beam inspection apparatus 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 15:
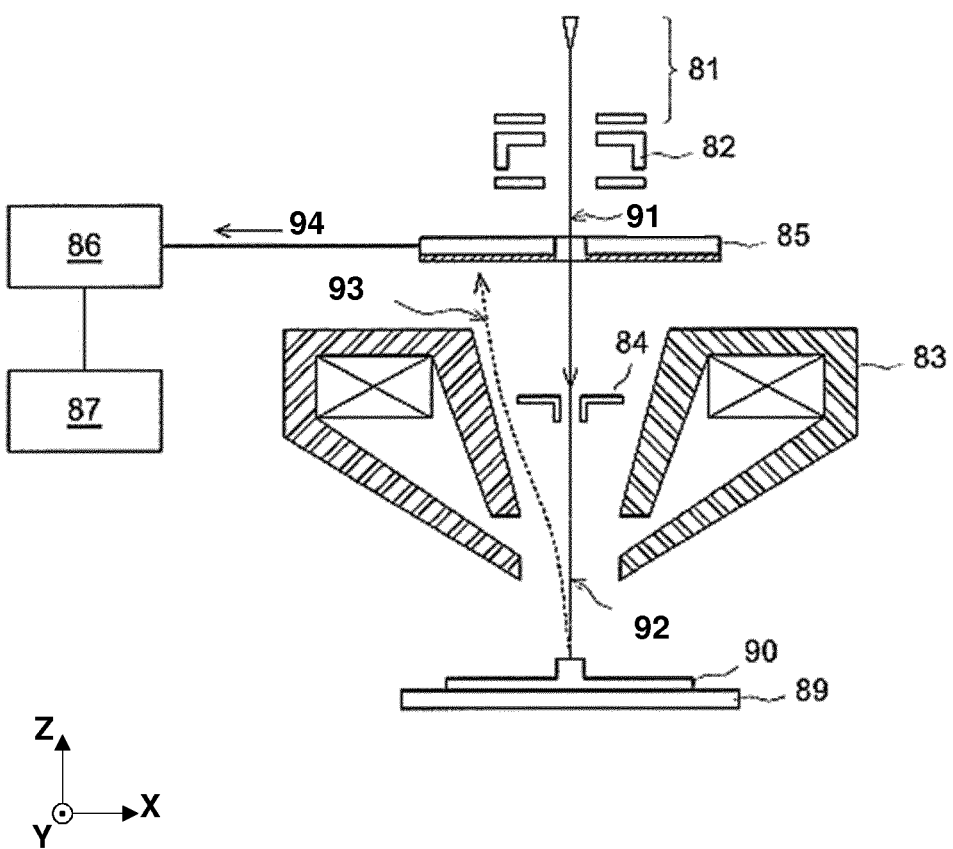
FIG. 15 schematically depicts an embodiment of an electron beam inspection apparatus, according to an embodiment.

FIG. 15 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 14 that uses a probe to inspect a substrate, the electron current in the system of FIG. 15 is significantly larger compared to, e.g., a CD SEM such as depicted in FIG. 14, such that the probe spot is large enough so that the inspection speed can be fast. However, the resolution may not be as high as compared to a CD SEM because of the large probe spot. In an embodiment, the above discussed inspection apparatus (in FIG. 13 or 14) may be single beam or a multi-beam apparatus without limiting the scope of the present disclosure.

The SEM images, from, e.g., the system of FIG. 14 and/or FIG. 15, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

According to an embodiment there is provided a method of determining candidate patterns from a set of patterns of a patterning process. The method includes steps for obtaining (i) a set of patterns of a patterning process, (ii) a search pattern having a first feature and a second feature adjacent to the first feature, and (iii) a first search condition comprising a relative position between the first feature and the second feature of the search pattern; and determining, via a processor, a first set of candidate patterns from the set of patterns that satisfies the first search condition associated with the first feature and the second feature of the search pattern.

In an embodiment, the relative position is defined between an element of the first feature and an element of the second feature of the search pattern.

In an embodiment, the element comprises an edge, and/or a vertex of the respective feature.

In an embodiment, the first search condition further comprises a tolerance limit associated with the relative position between elements of the features and/or a dimension of the features.

In an embodiment, the first feature and the second feature are on a same layer.

In an embodiment, the first feature and the second feature are on different layers.

In an embodiment, the method further includes obtaining a bounding box around the search pattern and a second search condition associated with the bounding box and a feature of the search pattern; and determining, via the processor, a second set of candidate patterns from the first set of candidate patterns that satisfies the second search condition associated the bounding box.

In an embodiment, the second search condition comprises a relative position between an edge of the feature of the search pattern and an edge of the bounding box.

In an embodiment, the relative position is a distance, and/or an angle between the edge of the feature of the search pattern and the edge of the bounding box In an embodiment, the second search condition further comprises a tolerance limit associated with the relative position between an element of the feature of the search pattern and the bounding box.

In an embodiment, the second search condition is associated with a feature of the search pattern that is closest to the bounding box.

In an embodiment, the determining the second set of candidate patterns further includes comparing one or more parameters of a feature of the search pattern and corresponding one or more parameters of a feature of the set of patterns.

In an embodiment, wherein the one or more parameters comprises at least one of: an edge of the feature; size of the feature; and topology of the feature.

In an embodiment, the determining the second set of candidate patterns further includes adjusting the bounding box around the search pattern based on the second search condition; and determining the second set of candidate patterns from the first set of candidate patterns that satisfies the second search condition associated the adjusted bounding box.

In an embodiment, the adjusting the bounding box includes increasing and/or decreasing the size of the bounding box relative to increase and/or decrease in the size of the feature of the field pattern and the second search condition.

In an embodiment, an amount of increase and/or decrease in size of the bounding box is within the tolerance limit associated with the relative position between elements of the feature of the search pattern and the bounding box.

In an embodiment, the set of patterns is obtained from an image of patterns of a printed substrate and/or simulated patterns of the substrate.

In an embodiment, the set of patterns is obtained from a scanning electron microscope image.

In an embodiment, the search pattern includes a plurality of features, wherein the plurality of features are on the same layer of the substrate and/or different layers of the substrate.

Furthermore, according to an embodiment there is provided a method of determining candidate patterns from a set of patterns. The method includes obtaining (i) a first set of candidate patterns from a set of patterns based on a first search condition associated with features of a search pattern (ii) a bounding box around the search pattern, and (iii) a second search condition associated with the bounding box and a feature of the search pattern; and determining a second set of candidate patterns from the first set of candidate patterns based on the second search condition.

In an embodiment, the second search condition is a distance, and/or an angle between the edge of the feature of the search pattern and the edge of the bounding box.

In an embodiment, the second search condition further comprises a tolerance limit associated with the distance and/or the angle between an element of the feature of the search pattern and the bounding box.

In an embodiment, the determining the second set of candidate patterns further includes comparing one or more parameters of a feature of the search pattern and corresponding one or more parameters of a feature of the set of patterns; and selecting, based on the comparison, a subset of patterns from the first set of candidate patterns excluding patterns with topological mismatch.

In an embodiment, the one or more parameters comprises at least one of: an edge of the feature; size of the feature; and topology of the feature.

In an embodiment, the determining the second set of candidate patterns further includes adjusting the bounding box around the search pattern based on the second search condition; and determining the second set of candidate patterns from the first set of candidate patterns that satisfies the second search condition associated the adjusted bounding box.

In an embodiment, the adjusting the bounding box includes increasing and/or decreasing the size of the bounding box as a function of the size of the feature of the field pattern and the second search condition.

In an embodiment, an amount of increase and/or decrease in size of the bounding box is within the tolerance limit associated with the relative position between elements of the feature of the search pattern and the bounding box.

Furthermore, according to an embodiment there is provided a method of determining candidate patterns from a set of patterns of a patterning process. The method includes obtaining (i) a first set of candidate patterns from a set of patterns based on a first search condition associated with features of a search pattern (ii) a bounding box around the search pattern, and (iii) a second search condition associated with the bounding box and a feature of the search pattern; and determining a second set of candidate patterns from the first set of candidate patterns based on the second search condition, wherein the second set of candidate patterns include a candidate pattern having an extra feature that is not included in the search pattern.

In an embodiment, the extra feature is adjacent to a feature of the search pattern and within the bounding box.

In an embodiment, the extra feature is on a same layer and/or a different layer than features of the search pattern.

In an embodiment, the extra feature is not associated with constraints relative to the features of the search pattern or the bounding box.

In an embodiment, the determining the second set of candidate patterns further includes comparing one or more parameters of a feature of the search pattern and corresponding one or more parameters of a feature of the set of patterns; and selecting, based on the comparison, patterns from the first set of candidate patterns without excluding patterns with topological mismatch.

In an embodiment, the one or more parameters comprises at least one of: an edge of the feature; size of the feature; and topology of the feature.

Furthermore, according to an embodiment there is provided a method of determining candidate patterns from a set of patterns of a patterning process. The method includes applying, via an interface, a first condition between a first feature and a second feature of the search pattern; determining, via a processor, a first set of candidate patterns on a set of patterns based on the first constraint; drawing, via the interface, a bounding box around the search pattern; applying, via the interface, a second condition between the first feature or the second feature, and the bounding box; and determining, via the processor, a second set of candidate patterns from the first set of candidate patterns based on the second condition, wherein the second set of candidate patterns include a candidate pattern having an extra feature that is not included in the search pattern.

In an embodiment, the applying the first condition includes selecting an edge of the first feature and an edge of the second feature of the search pattern; assigning a distance between the selected edges; and/or assigning a tolerance limit to the distance between the selected edges.

Furthermore, according to an embodiment there is provided a method of generating a search pattern database. The method includes obtaining a set of patterns, a pattern of the set of patterns comprises a plurality of features; applying, via an interface, a set of search conditions to the set of patterns to generate a set of search patterns, wherein a search pattern is associated with a search condition; evaluating, via a processor, whether a conflict exist between one or more search conditions associated with one or more features of the set of patterns; and storing, via the processor, the set of search patterns and associated set of search conditions for which no conflict exist.

In an embodiment, the evaluating the conflicts includes identifying features of the set of patterns having same search conditions; and/or determining whether the search conditions exceed a predetermined threshold related to a feature of a pattern of the set of patterns; and/or displaying the identified features to modify the conditions to eliminate conflict.

Furthermore, according to an embodiment there is provided a computer program product comprising a non-transitory computer readable medium having instructions recorded thereon, the instructions when executed by a computer implementing the steps of any methods discussed above.

Figure 16:
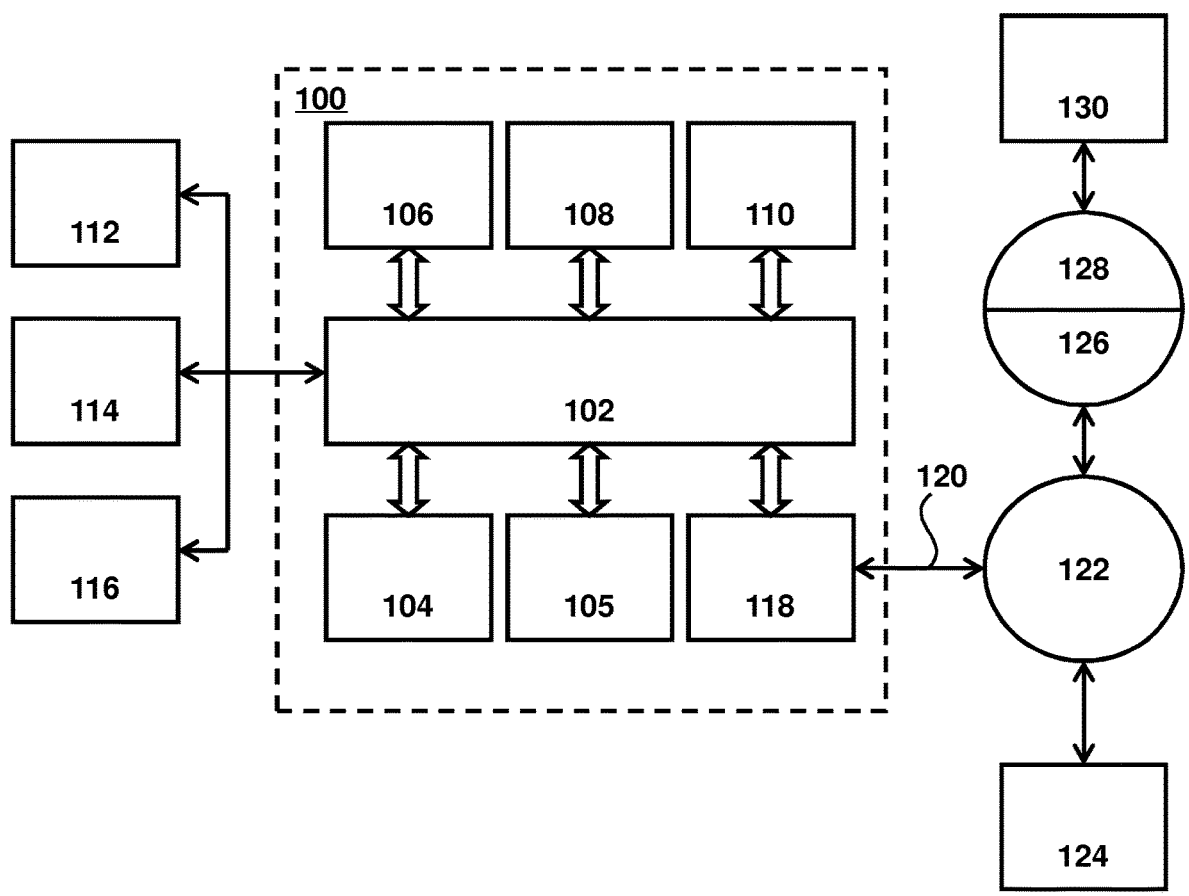
FIG. 16 is a block diagram of an example computer system according to an embodiment.

FIG. 16 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 17:
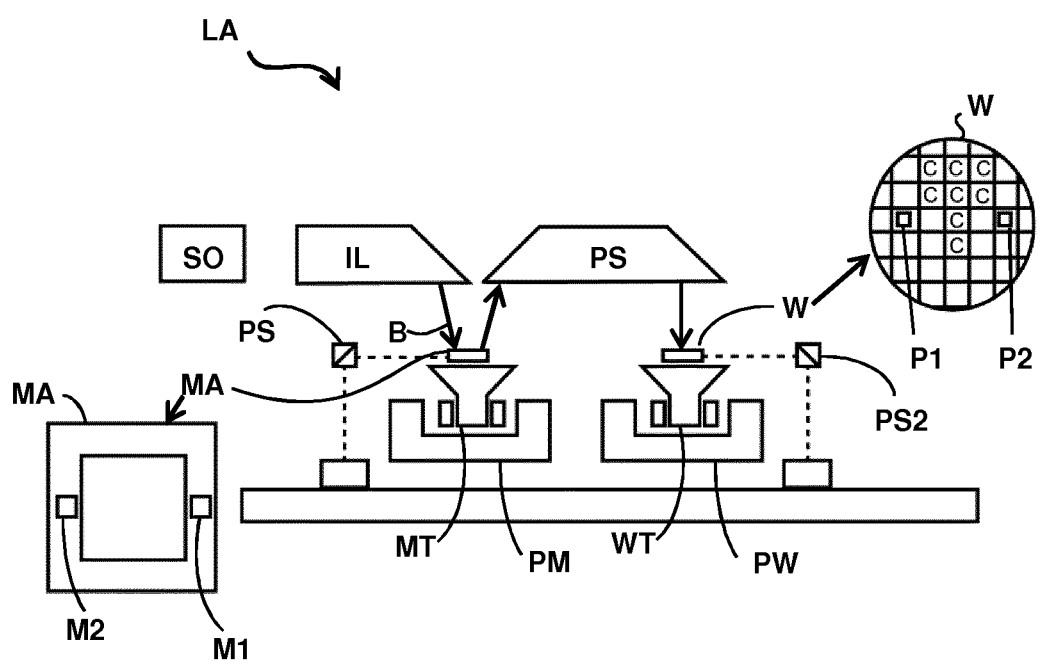
FIG. 17 is a schematic diagram of another lithographic projection apparatus according to an embodiment

FIG. 17 schematically depicts another exemplary lithographic projection apparatus LA that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 17, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 17, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 18:
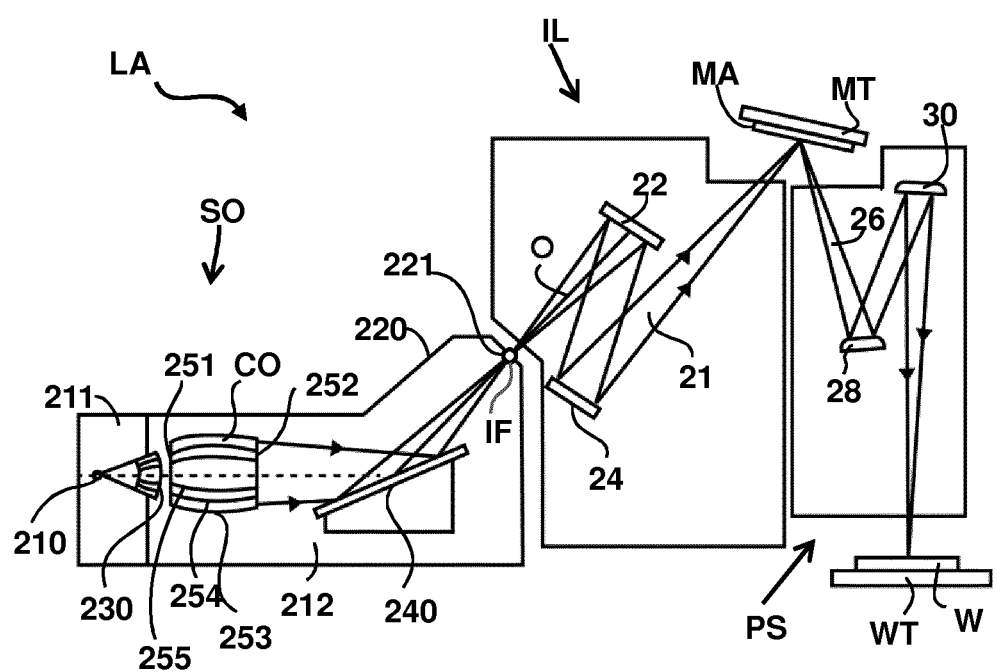
FIG. 18 is a more detailed view of the apparatus in FIG. 17 according to an embodiment.

FIG. 18 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 18.

Collector optic CO, as illustrated in FIG. 18, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 19:
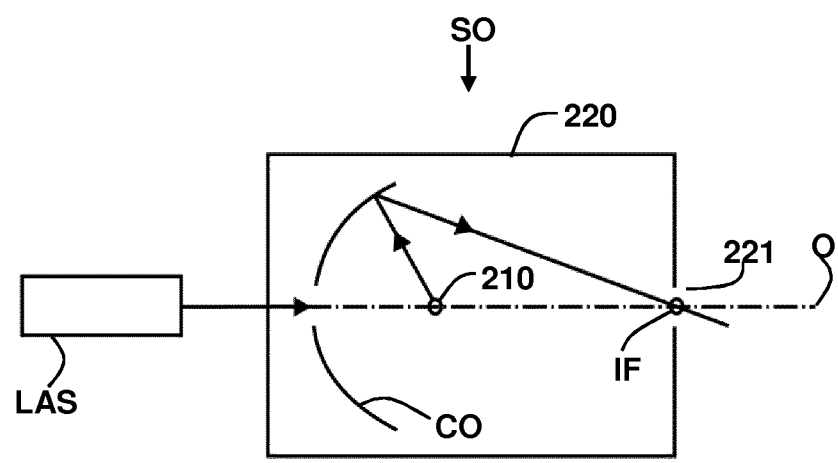
FIG. 19 is a more detailed view of the source collector module of the apparatus of FIG. 17 and FIG. 18 according to an embodiment.

Alternatively, the source collector module SO may be part of an LPP radiation system as shown in FIG. 19. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of determining candidate patterns from a set of patterns of a patterning process, the method comprising:
   obtaining (i) a set of patterns of a patterning process, (ii) a search pattern having a first feature and a second feature, and (iii) a first search condition comprising a relative position between the first feature and the second feature of the search pattern; and
   determining, via a processor, a first set of candidate patterns from the set of patterns that satisfies the first search condition associated with the first feature and the second feature of the search pattern.
2. The method of clause 1, wherein the relative position is defined between an element of the first feature and an element of the second feature of the search pattern.
3. The method of clause 2, wherein the element comprises an edge, and/or a vertex of the respective feature.
4. The method of any of clauses 1-3, wherein the first search condition further comprises a tolerance limit associated with the relative position between elements of the features and/or a dimension of the features.
5. The method of any of clauses 1-4, wherein the first feature and the second feature are on a same layer.
6. The method of any of clauses 1-4, wherein the first feature and the second feature are on different layers.
7. The method of any of clauses 1-6, further comprising:
   obtaining a bounding box around the search pattern and a second search condition associated with the bounding box and a feature of the search pattern; and
   determining, via the processor, a second set of candidate patterns from the first set of candidate patterns that satisfies the second search condition associated the bounding box.
8. The method of clause 7, wherein the second search condition comprises a relative position between an edge of the feature of the search pattern and an edge of the bounding box.
9. The method of clause 8, wherein the relative position is a distance, and/or an angle between the edge of the feature of the search pattern and the edge of the bounding box
10. The method of any of clauses 7-9, wherein the second search condition further comprises a tolerance limit associated with the relative position between an element of the feature of the search pattern and the bounding box.
11. The method of any of clauses 1-10, wherein the second search condition is associated with a feature of the search pattern that is closest to the bounding box.
12. The method of any of clauses 1-11, wherein the determining the second set of candidate patterns further comprises:
   comparing one or more parameters of a feature of the search pattern and corresponding one or more parameters of a feature of the set of patterns.
13. The method of clause 12, wherein the one or more parameters comprises at least one of:
   an edge of the feature;
   size of the feature; and
   topology of the feature.
14. The method of any of clauses 1-13, wherein the determining the second set of candidate patterns further comprises:
   adjusting the bounding box around the search pattern based on the second search condition; and
   determining the second set of candidate patterns from the first set of candidate patterns that satisfies the second search condition associated the adjusted bounding box.
15. The method of clause 14, wherein the adjusting the bounding box comprises:
   increasing and/or decreasing the size of the bounding box relative to increase and/or decrease in the size of the feature of a pattern of the set of the set of patterns and the second search condition.
16. The method of clause 14, wherein an amount of increase and/or decrease in size of the bounding box is within the tolerance limit associated with the relative position between elements of the feature of the search pattern and the bounding box.
17. The method of any of clauses 1-16, wherein the set of patterns is a design pattern; and/or an image of patterns of a printed substrate; and/or simulated patterns of the substrate.
18. The method of clause 17, wherein the set of patterns is obtained from a scanning electron microscope image.
19. The method of clause 18, wherein the search pattern includes a plurality of features, wherein the plurality of features are on the same layer of the substrate and/or different layers of the substrate.
20. The method of any of clauses 1-19, wherein the second feature is adjacent to the first feature.

21. A method of determining candidate patterns from a set of patterns, the method comprising:

obtaining (i) a first set of candidate patterns from a set of patterns based on a first search condition associated with features of a search pattern (ii) a bounding box around the search pattern, and (iii) a second search condition associated with the bounding box and a feature of the search pattern; and determining a second set of candidate patterns from the first set of candidate patterns based on the second search condition.

22. The method of clause 21, wherein the second search condition is a distance, and/or an angle between the edge of the feature of the search pattern and the edge of the bounding box 23. The method of clause 22, wherein the second search condition further comprises a tolerance limit associated with the distance and/or the angle between an element of the feature of the search pattern and the bounding box.

24. The method of any of clauses 21-23, wherein the determining the second set of candidate patterns further comprises:

comparing one or more parameters of a feature of the search pattern and corresponding one or more parameters of a feature of the set of patterns; and selecting, based on the comparison, a subset of patterns from the first set of candidate patterns excluding patterns with topological mismatch.

25. The method of clause 24, wherein the one or more parameters comprises at least one of:
an edge of the feature;
size of the feature; and
topology of the feature.

26. The method of any of clauses 21-25, wherein the determining the second set of candidate patterns further comprises:

adjusting the bounding box around the search pattern based on the second search condition; and determining the second set of candidate patterns from the first set of candidate patterns that satisfies the second search condition associated the adjusted bounding box.

27. The method of clause 26, wherein the adjusting the bounding box comprises:

increasing and/or decreasing the size of the bounding box as a function of the size of the feature of the set of patterns and the second search condition.

28. The method of clause 27, wherein an amount of increase and/or decrease in size of the bounding box is within the tolerance limit associated with the relative position between elements of the feature of the search pattern and the bounding box.

29. A method of determining candidate patterns from a set of patterns of a patterning process, the method comprising:

obtaining (i) a first set of candidate patterns from a set of patterns based on a first search condition associated with features of a search pattern (ii) a bounding box around the search pattern, and (iii) a second search condition associated with the bounding box and a feature of the search pattern; and determining a second set of candidate patterns from the first set of candidate patterns based on the second search condition, wherein the second set of candidate patterns include a candidate pattern having an extra feature that is not included in the search pattern.

30. The method of clause 29, wherein the extra feature is adjacent to a feature of the search pattern and within the bounding box.

31. The method of any of clauses 29-30, wherein the extra feature is on a same layer and/or a different layer than features of the search pattern.

32. The method of any of clauses 29-31, wherein the extra feature is not associated with constraints relative to the features of the search pattern or the bounding box.

33. The method of any of clauses 29-32, wherein the determining the second set of candidate patterns further comprises:

comparing one or more parameters of a feature of the search pattern and corresponding one or more parameters of a feature of the set of patterns; and selecting, based on the comparison, patterns from the first set of candidate patterns without excluding patterns with topological mismatch.

34. The method of clause 33, wherein the one or more parameters comprises at least one of:
an edge of the feature;
size of the feature; and
topology of the feature.

35. A method of determining candidate patterns from a set of patterns of a patterning process, the method comprising:

applying, via an interface, a first condition between a first feature and a second feature of the search pattern;

determining, via a processor, a first set of candidate patterns on a set of patterns based on the first constraint;

drawing, via the interface, a bounding box around the search pattern;

applying, via the interface, a second condition between the first feature or the second feature, and the bounding box; and determining, via the processor, a second set of candidate patterns from the first set of candidate patterns based on the second condition, wherein the second set of candidate patterns include a candidate pattern having an extra feature that is not included in the search pattern.

36. The method of clause 35, wherein the applying the first condition comprising:

selecting an edge of the first feature and an edge of the second feature of the search pattern;
assigning a distance between the selected edges; and/or
assigning a tolerance limit to the distance between the selected edges.

37. A method of generating a search pattern database, the method comprising:

obtaining a set of patterns, a pattern of the set of patterns comprises a plurality of features;

applying, via an interface, a set of search conditions to the set of patterns to generate a set of search patterns, wherein a search pattern is associated with a search condition;

evaluating, via a processor, whether a conflict exist between one or more search conditions associated with one or more features of the set of patterns; and storing, via the processor, the set of search patterns and associated set of search conditions for which no conflict exist.

38. The method of clause 37, wherein the evaluating the conflicts comprises:

identifying features of the set of patterns having same search conditions; and/or determining whether the search conditions exceed a predetermined threshold related to a feature of a pattern of the set of patterns; and/or displaying the identified features to modify the conditions to eliminate conflict.

39. A computer program product comprising a non-transitory computer readable medium having instructions recorded thereon, the instructions when executed by a computer implementing the method of any of clauses 1-38.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A non-transitory computer readable storage medium having instructions therein, the instructions, when executed by a processor system, configured to cause the processor system to at least:
    obtain (i) a set of patterns of a patterning process, (ii) a search pattern having a first feature and a second feature, and (iii) a search condition comprising a relative position between the first feature and the second feature of the search pattern; and
    determine a set of candidate patterns from the set of patterns that satisfies the search condition associated with the first feature and the second feature of the search pattern.

2. The medium of claim 1, wherein the relative position is defined between an element of the first feature and an element of the second feature of the search pattern.

3. The medium of claim 2, wherein the element comprises an edge and/or a vertex of the respective feature.

4. The medium of claim 1, wherein the search condition further comprises a tolerance limit associated with the relative position between elements of the features and/or a dimension of the features.

5. The medium of claim 1, wherein the first feature and the second feature are on a same layer.

6. The medium of claim 1, wherein the first feature and the second feature are on different layers.

7. The medium of claim 1, wherein the instructions are further configured to cause the processor system to:
   obtain a bounding box around the search pattern and a search condition associated with the bounding box and a feature of the search pattern; and
   determine a subset of candidate patterns from the set of candidate patterns that satisfies the search condition associated with the bounding box.

8. The medium of claim 7, wherein the search condition associated with the bounding box comprises a relative position between an edge of the feature of the search pattern and an edge of the bounding box and/or an angle between the edge of the feature of the search pattern and the edge of the bounding box.

9. The medium of claim 7, wherein the search condition associated with the bounding box further comprises a tolerance limit associated with the relative position between an element of the feature of the search pattern and the bounding box.

10. The medium of claim 7, wherein the search condition associated with the bounding box is associated with a feature of the search pattern that is closest to the bounding box.

11. The medium of claim 7, wherein the instructions configured to cause the processor system to determine the subset of candidate patterns are further configured to compare one or more parameters of a feature of the search pattern and corresponding one or more parameters of a feature of the set of patterns.

12. The medium of claim 11, wherein the one or more parameters comprises at least one selected from:
   an edge of the feature;
   size of the feature; and/or
   topology of the feature.

13. The medium of claim 7, wherein the instructions configured to cause the processor system to determine the subset of candidate patterns are further configured to adjust the bounding box around the search pattern based on the search condition associated with the bounding box; and
   determine the subset of candidate patterns from the set of candidate patterns that satisfies the search condition associated with the adjusted bounding box.

14. The medium of claim 13, wherein the instructions configured to cause the processor system to adjust the bounding box are further configured to increase and/or decrease the size of the bounding box relative to increase and/or decrease in the size of the feature of a pattern of the set of patterns and the search condition associated with the bounding box.

15. The medium of claim 1, wherein the set of patterns comprises a design pattern; and/or comprises an image of patterns of a printed substrate; and/or comprises simulated patterns of the substrate.

16. A non-transitory computer readable storage medium having instructions therein, the instructions, when executed by a processor system, configured to cause the processor system to at least:
   obtain (i) a set of candidate patterns from a set of patterns based on a search condition associated with features of a search pattern (ii) a bounding box around the search pattern, and (iii) a search condition associated with the bounding box and a feature of the search pattern; and
   determine a subset of candidate patterns from the set of candidate patterns based on the search condition associated with the bounding box.

17. The medium of claim 16, wherein the search condition associated with the bounding box is a distance and/or an angle between the edge of the feature of the search pattern and the edge of the bounding box.

18. The medium of claim 16, wherein the instructions configured to cause the processor system to determine the subset of candidate patterns are further configured to cause the processor system to:
   compare one or more parameters of a feature of the search pattern and corresponding one or more parameters of a feature of the set of patterns; and
   select, based on the comparison, a subset of patterns from the set of candidate patterns excluding patterns with topological mismatch.

19. A non-transitory computer readable storage medium having instructions therein, the instructions, when executed by a processor system, configured to cause the processor system to at least:
   obtain (i) a set of candidate patterns from a set of patterns based on a search condition associated with features of a search pattern, (ii) a bounding box around the search pattern, and (iii) a search condition associated with the bounding box and a feature of the search pattern; and
   determine a subset of candidate patterns from the set of candidate patterns based on the search condition associated with the bounding box, wherein the subset of candidate patterns includes a candidate pattern having an extra feature that is not included in the search pattern.

20. The medium of claim 19, wherein the extra feature is adjacent to a feature of the search pattern and within the bounding box.

* * * * *